United States Patent
Kato

(10) Patent No.: US 10,593,541 B2
(45) Date of Patent: Mar. 17, 2020

(54) FILM DEPOSITION METHOD

(71) Applicant: Tokyo Electron Limited, Tokyo (JP)

(72) Inventor: Hitoshi Kato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 22 days.

(21) Appl. No.: 15/956,410

(22) Filed: Apr. 18, 2018

(65) Prior Publication Data

US 2018/0308688 A1    Oct. 25, 2018

(30) Foreign Application Priority Data

Apr. 25, 2017   (JP) .................. 2017-086670

(51) Int. Cl.
*H01L 21/02*   (2006.01)
*C23C 16/04*   (2006.01)
*C23C 16/40*   (2006.01)
*C23C 16/458*  (2006.01)
*C23C 16/46*   (2006.01)
*C23C 16/455*  (2006.01)
*C23C 16/507*  (2006.01)

(52) U.S. Cl.
CPC ...... *H01L 21/02126* (2013.01); *C23C 16/045* (2013.01); *C23C 16/402* (2013.01); *C23C 16/4554* (2013.01); *C23C 16/4584* (2013.01); *C23C 16/45534* (2013.01); *C23C 16/45551* (2013.01); *C23C 16/46* (2013.01); *C23C 16/507* (2013.01); *H01L 21/0228* (2013.01); *H01L 21/02211* (2013.01); *H01L 21/02219* (2013.01); *H01L 21/02274* (2013.01)

(58) Field of Classification Search
None
See application file for complete search history.

(56) References Cited

U.S. PATENT DOCUMENTS

| 2001/0019903 A1* | 9/2001 | Shufflebotham ...... C23C 16/402 438/788 |
| 2015/0325434 A1* | 11/2015 | Yamamoto ........ H01L 21/32051 438/762 |
| 2018/0315598 A1* | 11/2018 | Li ..................... H01L 21/02216 |
| 2019/0172708 A1* | 6/2019 | Takamure .......... H01L 21/02129 |

FOREIGN PATENT DOCUMENTS

JP     2013-135154    7/2013

* cited by examiner

*Primary Examiner* — Asok K Sarkar
(74) *Attorney, Agent, or Firm* — IPUSA, PLLC

(57) ABSTRACT

A film deposition method is provided. In the method, an aminosilane gas is adsorbed on a surface of a substrate including a recess pattern. Next, a silicon oxide film is deposited on the surface of the substrate including the recess pattern by oxidizing the aminosilane gas adsorbed on the surface of the substrate using an oxidation gas. Then, the silicon oxide film is modified by supplying a mixed gas containing oxygen, argon and nitrogen to the silicon oxide film while activating the mixed gas by plasma.

14 Claims, 18 Drawing Sheets

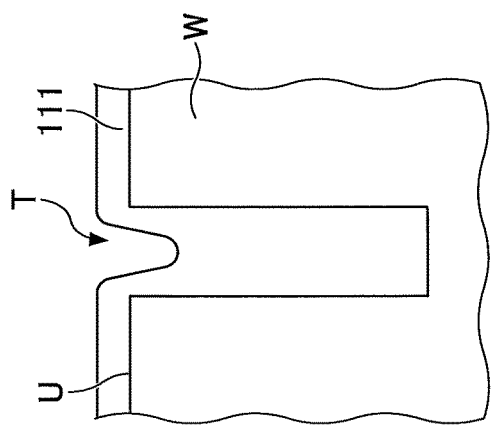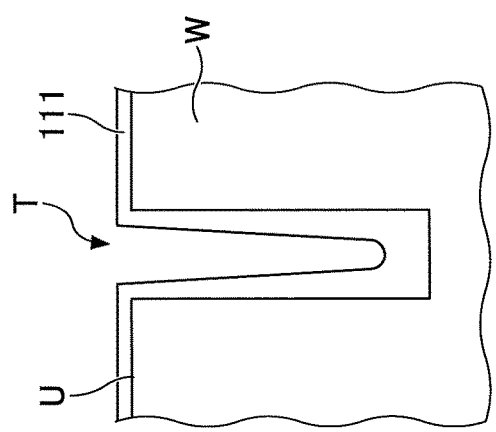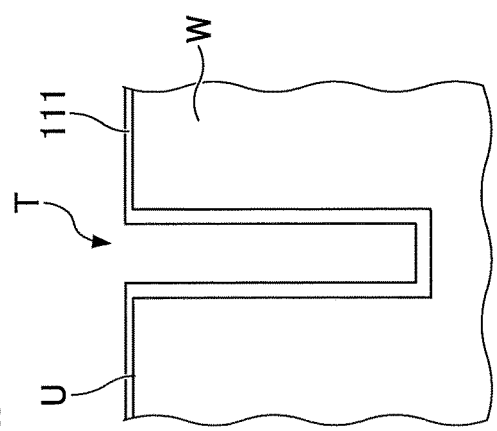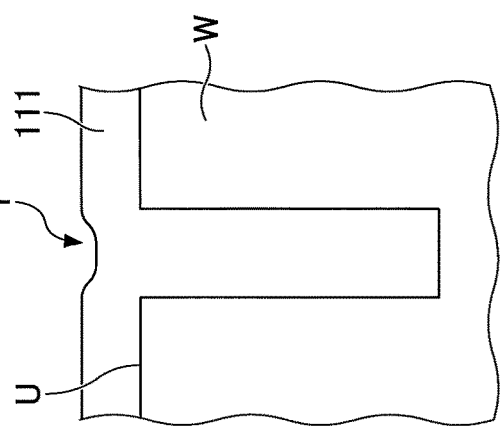

FILM DEPOSITION METHOD

CROSS-REFERENCE TO RELATED APPLICATION

The present application is based on and claims priority to Japanese Patent Application No. 2017-086670 filed on Apr. 25, 2017, the entire contents of which are hereby incorporated herein by reference.

BACKGROUND OF THE INVENTION

1. Field of the Invention

The present invention relates to a film deposition method.

2. Description of the Related Art

Conventionally, as disclosed in Japanese Patent Application Publication No. 2013-135154, a method is known of depositing a film made of a reaction product of a first reaction gas and a second reaction gas that reacts with the first reaction gas. The method includes steps of adsorbing hydroxyl radicals on an inner surface of a recess formed in a substrate at a desired distribution, supplying the first reaction gas to the substrate having the hydroxyl radicals adsorbed on the inner surface of the recess, and supplying the second reaction gas to the substrate on which the first reaction gas is adsorbed, thereby producing the reaction product by causing the first reaction gas to react with the second reaction gas.

According to the film deposition method disclosed in Japanese Patent Application Publication No. 2013-135154, because the hydroxyl radicals form an adsorption site of the first reaction gas, a bottom-up deposition can be achieved by causing the hydroxyl radicals to be formed more on a bottom surface of the inner surface of the recess than the other location of the inner surface of the recess. Moreover, Japanese Patent Application Publication No. 2013-135154 discloses an example of supplementing deficient hydroxyl radicals by exposing the substrate to oxygen plasma in the step of adsorbing the hydroxyl radicals, thereby generating the oxygen plasma from a gas containing a hydrogen-containing gas, as an example of causing the desired hydroxyl radicals to adsorb on the bottom of the recess.

However, to perform the bottom-up deposition as described above, because the hydroxyl radicals on a top surface of the substrate and around an upper portion of the recess need to be decreased so as not to form the adsorption site on the top surface of the substrate and around the upper portion of the recess, the use of the hydrogen-containing gas in generating the oxygen plasma is not preferable.

In the meantime, hydrogen gas has properties of facilitating ignition of plasma and generating the plasma uniformly, and exhibits the properties even when generating plasma from a mixed gas containing oxygen, thereby serving to generate oxygen plasma uniformly. Hence, when the oxygen plasma is generated without using hydrogen, the oxygen plasma may be generated unevenly, and a uniform plasma process may not be achieved.

SUMMARY OF THE INVENTION

The present disclosure is made in light of the above problems, and provides a film deposition method capable of stably generating oxygen plasma without using a hydrogen-containing gas and depositing a silicon oxide film with uniformity across a surface of a substrate.

According to an embodiment, there is provided a film deposition method. In the method, an aminosilane gas is adsorbed on a surface of a substrate including a recess pattern. Next, a silicon oxide film is deposited on the surface of the substrate including the recess pattern by oxidizing the aminosilane gas adsorbed on the surface of the substrate using an oxidation gas. Then, the silicon oxide film is modified by supplying a mixed gas containing oxygen, argon and nitrogen to the silicon oxide film while activating the mixed gas by plasma.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIGS. 11A through 11D are second schematic diagrams for explaining a film deposition method according to an embodiment;

DETAILED DESCRIPTION OF THE PREFERRED EMBODIMENTS

Embodiments of the present disclosure are described below with reference to the accompanying drawings.

[Film Deposition Apparatus]

Figure 1:
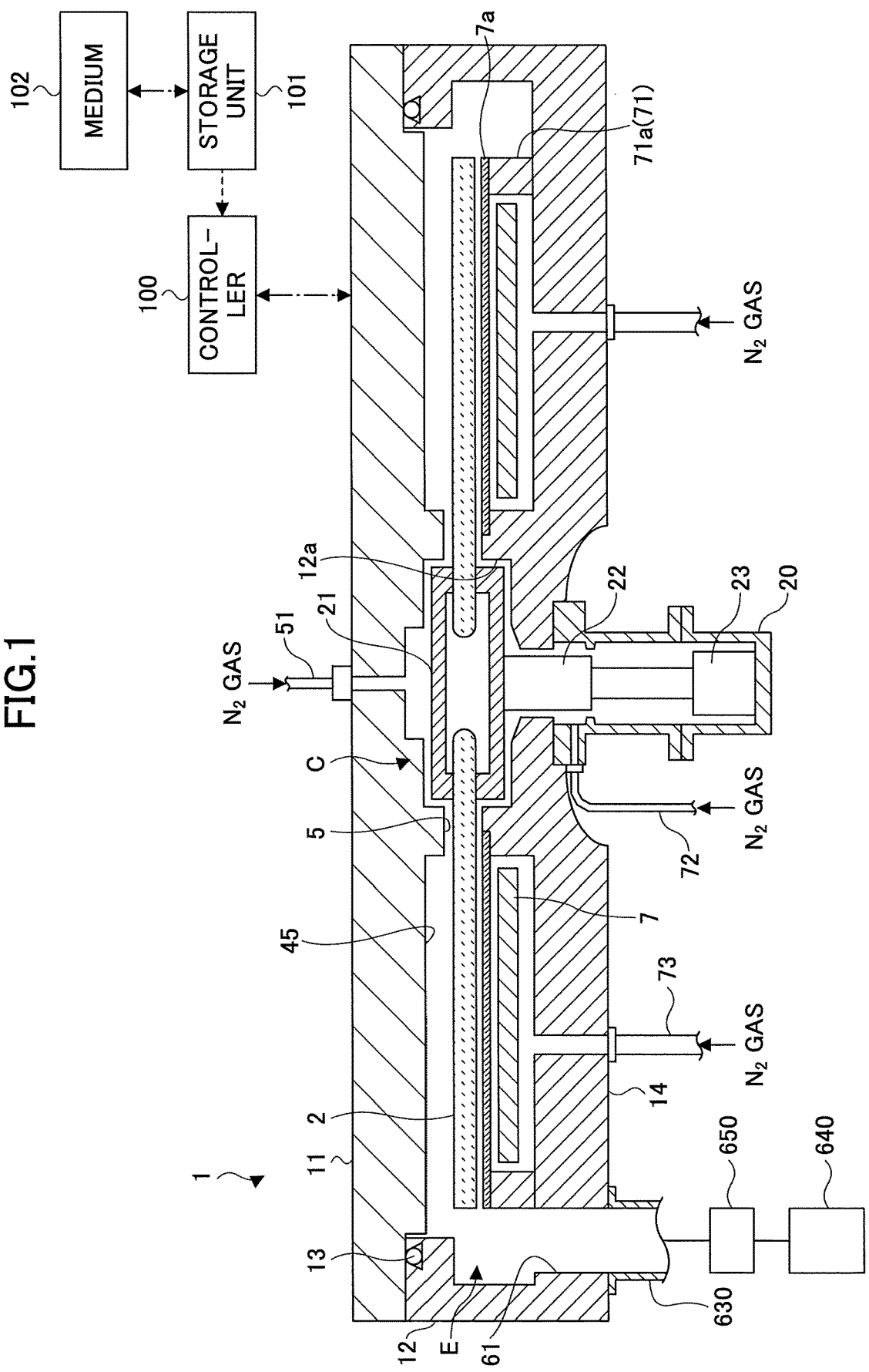
FIG. 1 a cross-sectional view of an example of a film deposition apparatus according to an embodiment of the disclosure.
Figure 2:
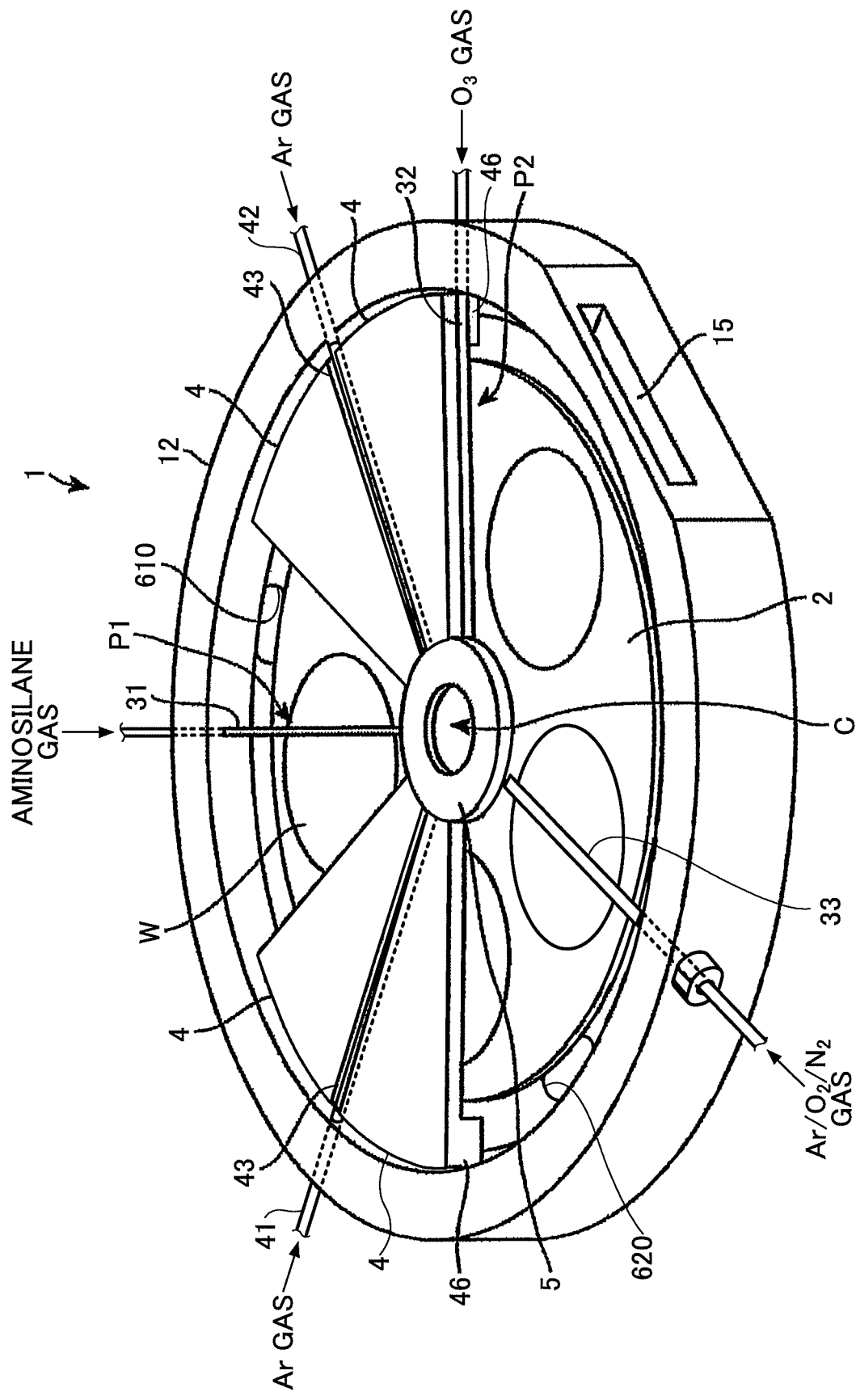
FIG. 2 is a perspective view illustrating an inside structure of a vacuum chamber of the film deposition apparatus illustrated in FIG. 1.
Figure 3:
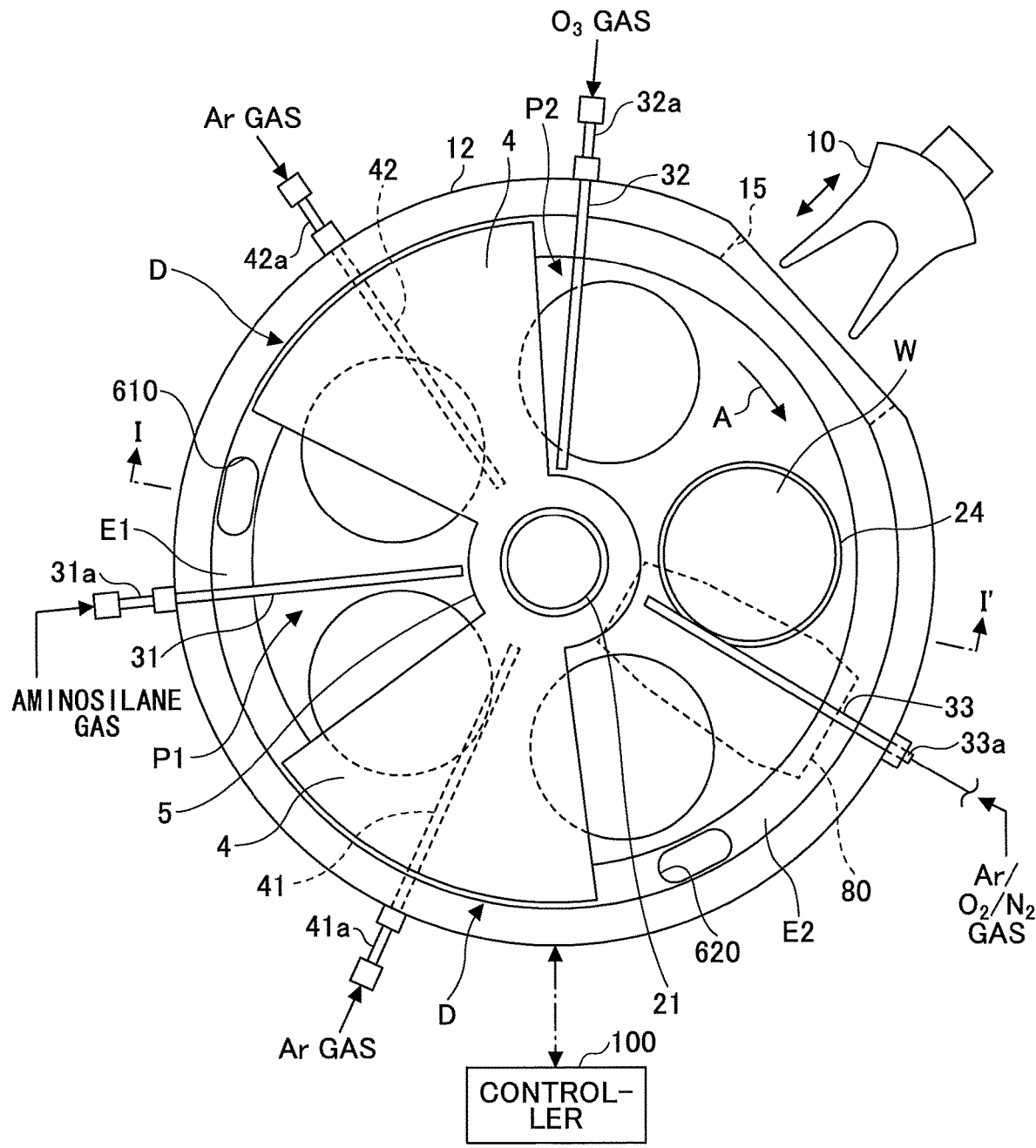
FIG. 3 is a schematic top view illustrating an example of the vacuum chamber of the film deposition apparatus illustrated in FIG. 1.

To begin with, a film deposition apparatus for performing a film deposition method according to the embodiment is described below. With reference to FIGS. 1 through 3, the film deposition apparatus 1 includes a vacuum chamber 1 that has a substantially flat circular shape, and a turntable 2 that is provided in the vacuum chamber 1 and has a center of rotation at the center of the vacuum chamber 1. The vacuum chamber 1 includes a chamber body 12 having a cylindrical shape with a bottom surface, and a ceiling plate 11 placed on the upper surface of the chamber body 12. The ceiling plate 11 is detachably placed on the chamber body 12 via a sealing member 13 (FIG. 1) such as an O-ring in an airtight manner.

The turntable 2 is attached to the cylindrical shaped core unit 21 at its center portion. The core unit 21 is fixed to the upper end of the rotary shaft 22 that extends in a vertical direction. The rotary shaft 22 is provided to penetrate the bottom portion 14 of the vacuum chamber 1 and its lower end is attached to the driving unit 23 that rotates the rotary shaft 22 (FIG. 1) around the vertical direction. The rotary shaft 22 and the driving unit 23 are housed in the tubular case body 20 whose upper surface is open. The case body 20 is attached to a lower surface of the bottom portion 14 of the vacuum chamber 1 via a flange portion provided at its upper surface in an airtight manner so that inner atmosphere of the case body 20 is isolated from outside atmosphere.

As illustrated in FIG. 2 and FIG. 3, a plurality of (five in this case) circular concave portions 24 is provided in a top surface of the turntable 2 along a rotational direction (circumferential direction) for holding a plurality of semiconductor wafers (which will be simply referred to as "wafers" hereinafter) W. FIG. 3 illustrates a single wafer W placed only in one of the concave portions 24 for an explanatory purpose. Each of the concave portions 24 is formed to have a slightly larger (for example, 4 mm larger) diameter than that (for example, 300 mm) of the wafer W, and a depth substantially equal to the thickness of the wafer W. Thus, when the wafer W is mounted in the respective concave portion 24, the surface of the wafer W and the surface of the turntable 2 (where the wafer W is not mounted) become almost the same height. Each of the concave portions 24 has, for example, three through holes, through which lift pins penetrate to support and lift a back surface of the wafer W.

FIG. 2 and FIG. 3 are diagrams for explaining inner structures of the vacuum chamber 1. As illustrated in FIG. 2 and FIG. 3, reaction gas nozzles 31, 32 and 33, and separation gas nozzles 41 and 42, which are made of quartz, for example, are provided above the turntable 2 and arranged in a circumferential direction of the vacuum chamber 1 (the rotational direction of the turntable 2 as illustrated by an arrow A in FIG. 3) with a distance from each other. In the example illustrated in FIG. 3, the reaction gas nozzle 33, the separation gas nozzle 41, the reaction gas nozzle 31, the separation gas nozzle 42, and the reaction gas nozzle 32 are arranged in this order from a transfer port 15 (which will be explained later) in a clockwise direction. Gas introduction ports 31a, 32a, 33a, 41a, and 42a (FIG. 3) that are base portions of the nozzles 31, 32, 33, 41, and 42, respectively, are fixed to an outer peripheral wall of the chamber body 12 so that these nozzles 31, 32, 33, 41, and 42 are introduced into the vacuum chamber 1 from the outer peripheral wall of the vacuum chamber 1 to extend in a radial direction and parallel to the surface of the turntable 2.

As simply illustrated by a dotted line for an explanatory purpose in FIG. 3, a plasma generator 80 is provided above the reaction gas nozzle 33. The plasma generator 80 is described below.

In the present embodiment, the reaction gas nozzle 31 is connected to a supplying source (not illustrated in the drawings) of an aminosilane gas as a first reaction gas via a pipe, a flow controller and the like (not illustrated in the drawings). The reaction gas nozzle 32 is connected to a supplying source (not illustrated in the drawings) of an oxidation gas as a second reaction gas via a pipe, a flow controller and the like (not illustrated in the drawings). The reaction gas nozzle 33 is connected to a supplying source (not illustrated in the drawings) of $Ar/O_2/N_2$ gas as a third reaction gas via a pipe, a flow controller and the like (not illustrated in the drawings). The separation gas nozzles 41 and 42 are connected to supplying sources (not illustrated in the drawings) of argon (Ar) gas as a separation gas via pipes and flow controller valves and the like, respectively. Here, the separation gas may be nitrogen ($N_2$) gas or helium (He) gas. A variety of gas may be used as the separation gas as long as the separation gas is an inert gas or a noble gas. In this case, the supplying source of the separation gas is filled with nitrogen or helium.

In the present embodiment, $O_3$ (ozone) gas is used as the oxidation gas.

In the present embodiment, DIPAS ((diisopropylamino) silane), 3DMAS (tris(dimethylamino)silane), BTBAS (bis (tertiary-butylamino)silane) and the like are cited as examples of the aminosilane gas.

The reaction gas nozzles 31 and 32 have a plurality of gas discharge holes 31h and 32h (see FIG. 4) that face downward to the turntable 2 along the longitudinal directions of the reaction gas nozzles 31 and 32 at a 10 mm interval, respectively, for example. A region below the reaction gas nozzle 31 is a first process region P1 in which the aminosilane gas adsorbs on the wafers W. A region below the reaction gas nozzle 32 is a second process region P2 in which the aminosilane gas adsorbed on the wafer W in the first process region P1 is oxidized. Here, a configuration of the reaction gas nozzle 33 that is not illustrated in FIG. 4 is described below.

Referring to FIG. 2 and FIG. 3, the ceiling plate 11 includes two convex portions 4 protruding in the vacuum chamber 1. Each of the convex portions 4 has substantially a fan-shaped top view shape where the apex is removed in an arc shape. The inner arc shaped portion of each of the convex portions 4 is connected to an inner protruding portion 5 (which will be described below with reference to FIG. 1 to FIG. 3) and the outer arc shaped portion is formed to extend along an inner peripheral surface of the chamber body 12 of the vacuum chamber 1.

Figure 4:
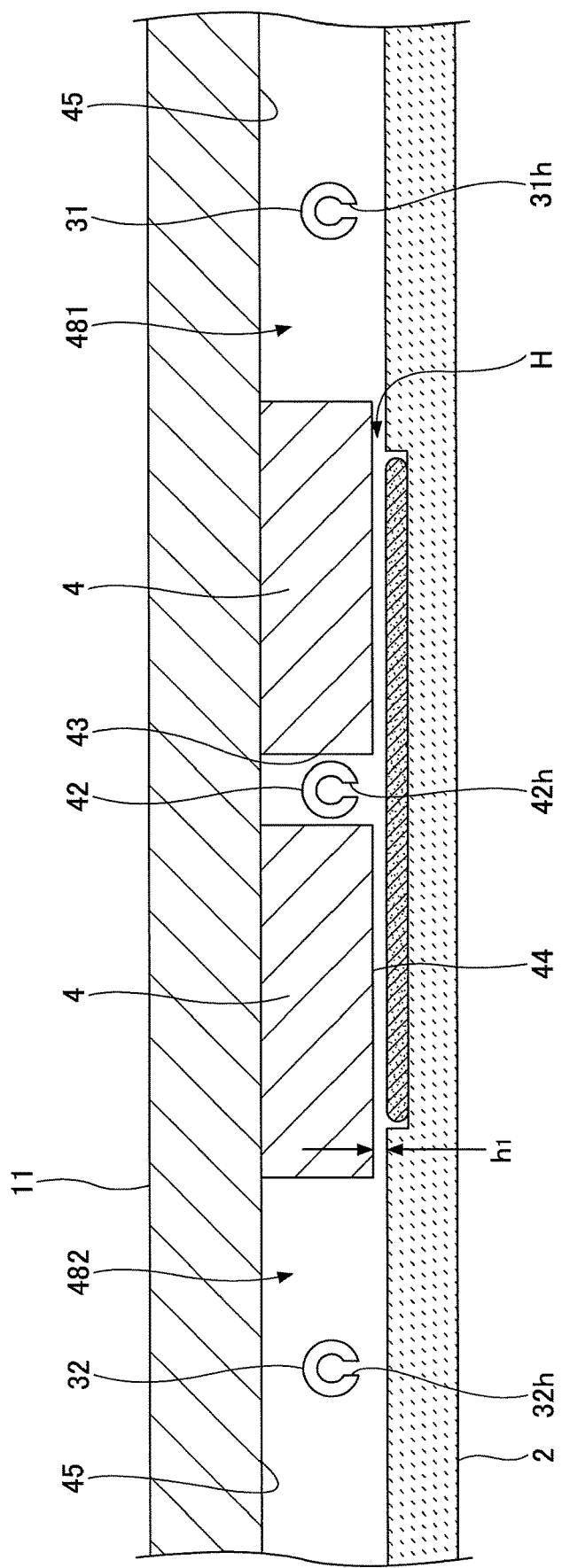
FIG. 4 is a partial cross-sectional view of an example of the film deposition apparatus illustrated in FIG. 1.

FIG. 4 illustrates a cross-section of the vacuum chamber 1 along a concentric circle of the turntable 2 from the reaction gas nozzle 31 to the reaction gas nozzle 32. As illustrated in FIG. 4, the convex portion 4 is fixed to the lower surface of the ceiling plate 11. Thus, the vacuum chamber 1 includes therein a flat low ceiling surface 44 (first ceiling surface) formed as the lower surface of the convex portion 4 and flat higher ceiling surfaces 45 (second ceiling surface) that are higher than the low ceiling surface 44 and arranged on both sides of the low ceiling surface 44 in the circumferential direction. The low ceiling surface 44 has substantially a fan-like top view shape where the apex is removed in an arc shape. Furthermore, as illustrated in the drawings, the convex portion 4 includes a groove portion 43 at a center in the circumferential direction. The groove portion 43 is formed to extend in the radial direction of the turntable 2. The separation gas nozzle 42 is positioned within the groove portion 43. Although not illustrated in FIG. 4, the separation gas nozzle 41 is also positioned within a groove portion provided in the other convex portion 4. The reaction gas nozzles 31 and 32 are provided in spaces under the high ceiling surfaces 45, respectively. The reaction gas nozzles 31 and 32 are provided in the vicinity of the wafers W apart from the high ceiling surfaces 45, respectively.

The separation gas nozzle 42 has a plurality of gas discharge holes 42h formed along the longitudinal direction of the separation gas nozzle 42 at a predetermined interval (10 mm, for example).

The low ceiling surface 44 provides a separation space H, which is a small space, with respect to the turntable 2. When Ar gas is supplied from the separation gas nozzle 42, Ar gas flows toward a space 481 and a space 482 through the separation space H. At this time, because the volume of the separation space H is smaller than those of the spaces 481 and 482, the pressure in the separation space H can be made higher than those in the spaces 481 and 482 by Ar gas. This means that the separation space H has a high pressure between the spaces 481 and 482. Moreover, Ar gas flowing from the separation space H toward the spaces 481 and 482 serves as a counter flow against the aminosilane gas from the gas first process region P1 and the oxidation gas from the second process region P2. Thus, the separation space H separates the aminosilane gas from the first process region P1 and the oxidation gas from the second process region P2. Therefore, the mixture and reaction of the aminosilane gas and the oxidation gas are prevented in the vacuum chamber 1.

The height h1 of the low ceiling surface 44 above an upper surface of the turntable 2 may be appropriately determined based on the pressure of the vacuum chamber 1 during the film deposition, the rotational speed of the turntable 2, and a supplying amount of the separation gas (Ar gas) in order to maintain the pressure in the separation space H higher than those in the spaces 481 and 482.

Referring to FIG. 1 through FIG. 3, the ceiling plate 11 includes the inner protruding portion 5 at its lower surface to surround the outer periphery of the core unit 21 that supports the turntable 2. The inner protruding portion 5 is continuously formed with the inner portions of the convex portions 4 and has a lower surface that is formed at the same height as those of the low ceiling surfaces 44, in the present embodiment.

Figure 5:
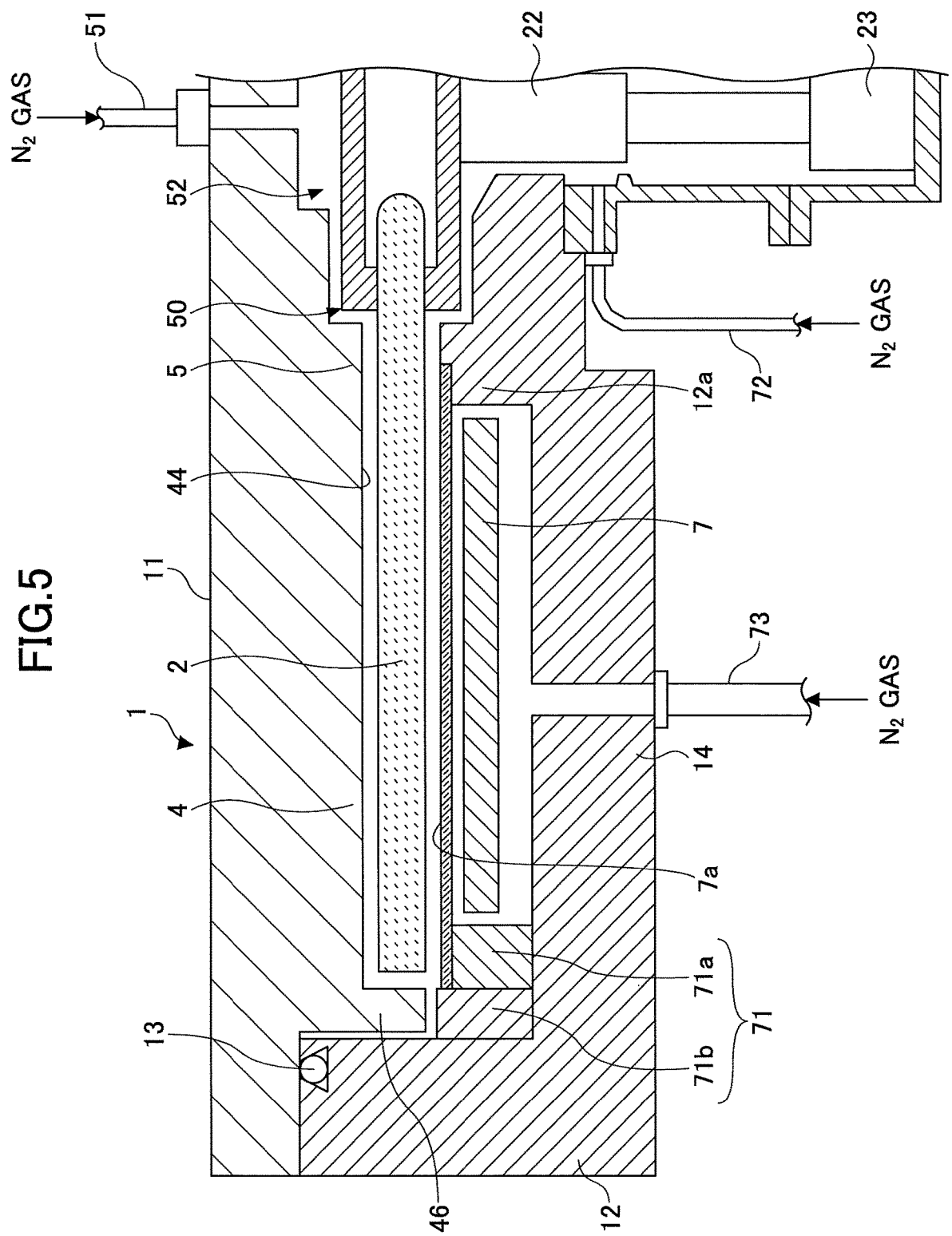
FIG. 5 is a partial cross-sectional view of an example of the film deposition apparatus illustrated in FIG. 1

FIG. 1 is a cross-sectional view taken along an I-I' line in FIG. 3, and illustrating a region where the ceiling surface 45 is provided. FIG. 5 is a partial cross-sectional view illustrating a region where the ceiling surface 44 is provided. As illustrated in FIG. 5, the convex portion 4 having a substantially fan-like top view shape includes an outer bending portion 46 at its outer periphery (at an outer peripheral end portion side of the vacuum chamber 1) that is bent to have an L-shape to face an outer end surface of the turntable 2. The outer bending portion 46 inhibits a flow of gas between the space 481 and the space 482 through the space between the turntable 2 and the inner peripheral surface of the chamber body 12. As described above, the convex portions 4 are provided on the ceiling plate 11 that is detachably attached to the chamber body 12. Thus, a slight space is formed between the outer peripheral surface of the outer bending portion 46 and the chamber body 12. The space between the inner peripheral surface of the outer bending portion 46 and an outer circumferential surface of the turntable 2, and the space between the outer peripheral surface of the outer bending portion 46 and the chamber body 12 may be a size same as the height h1 (see FIG. 4) of the low ceiling surface 44 with respect to the upper surface of the turntable 2, for example.

As illustrated in FIG. 5, the inner perimeter wall of the chamber body 12 is provided to extend in a vertical direction to be closer to the outer peripheral surface of the outer bending portion 46 at the separation region D. However, other than the separation region D, as illustrated in FIG. 1, for example, the inner perimeter wall of the chamber body 12 is recessed outward from a location facing the outer end surface of the turntable 2 to the bottom portion 14. Hereinafter, for an explanatory purpose, the recessed portion, having a substantially rectangular cross-sectional view, is referred to as an "evacuation area". Specifically, a part of the evacuation area that is in communication with the first process region P1 is referred to as a first evacuation area E1, and a part of the evacuation area that is in communication with the second process region P2 is referred to as a second evacuation area E2. As illustrated in FIG. 1 to FIG. 3, a first evacuation port 610 and a second evacuation port 620 are respectively provided at the bottom portions of the first evacuation area E1 and the second evacuation area E2. The first evacuation port 610 and the second evacuation port 620 are connected to vacuum pumps 640, which are vacuum evacuation units, via evacuation pipes 630, respectively, as illustrated in FIG. 1. In FIG. 1, a pressure regulator 650 is provided.

A heater unit 7 is provided at a space between the turntable 2 and the bottom portion 14 of the vacuum chamber 1 as illustrated in FIG. 1 and FIG. 5. The wafers W placed on the turntable 2 are heated by the heater unit 7 via the turntable 2 to a temperature (400° C., for example) determined by a process recipe. A ring cover member 71 is provided below the outer periphery of the turntable 2 in order to prevent gasses from being introduced into the space below the turntable 2. As illustrated in FIG. 5, the cover member 71 includes an inner member 71a that is provided to face the outer edge portion and the further outer portion of the turntable 2 from a lower side, and an outer member 71b that is provided between the inner member 71a and an inner wall surface of the chamber body 12. The outer member 71b is provided to face the outer bending portion 46, which is formed at an outer edge portion and on the lower side of each of the convex portions 4. The inner member 71a is provided to surround the entirety of the heater unit 7 below the outer end portion (and on a slightly outer side of the outer end portion) of the turntable 2.

As illustrated in FIG. 1, the bottom portion 14 of the vacuum chamber 1 closer to the rotation center than the space where the heater unit 7 is positioned protrudes upward to be close to the core unit 21 to form a protruded portion 12a. A small space is formed between the protruded portion 12a and the core unit 21. Further, a small space is formed between an inner peripheral surface of the bottom portion 14 and the rotary shaft 22 to be in communication with the case body 20. A purge gas supplying pipe 72 that supplies Ar gas as the purge gas to the small space for purging is provided in the case body 20. The bottom portion 14 of the vacuum chamber 1 includes a plurality of purge gas supplying pipes 73 (only one of the purge gas supplying pipes 73 is illustrated in FIG. 5) that are arranged at a predetermined angle interval in the circumferential direction below the heater unit 7 for purging the space where the heater unit 7 is provided. Further, a cover member 7a is provided between the heater unit 7 and the turntable 2 to prevent the gas from being introduced into the space where the heater unit 7 is provided. The cover member 7a is provided to extend from an inner peripheral wall (upper surface of the inner member 71a) of the outer member 71b to an upper end portion of the protruded portion 12a in the circumferential direction. The cover member 7a may be made of quartz, for example.

The film deposition apparatus further includes a separation gas supplying pipe 51 that is connected to a center portion of the ceiling plate 11 of the vacuum chamber 1 and provided to supply Ar gas as the separation gas to the space 52 between the ceiling plate 11 and the core unit 21. The separation gas supplied to the space 52 flows through a small space between the inner protruding portion 5 and the turntable 2 to flow along a top surface of the turntable 2 on which the wafers W are placed and to be discharged toward an outer periphery. The space 50 can be kept at a pressure higher than those of the space 481 and the space 482 by the separation gas. Thus, the space 50 can prevent the aminosilane gas supplied to the first process region P1 and the oxidation gas supplied to the second process region P2 from being mixed with each other by flowing through the center area C. This means that the space 50 (or the center area C) can serve similarly to the separation space H (or the separation area D).

Further, as illustrated in FIG. 2 and FIG. 3, a transfer port 15 is provided at a side wall of the vacuum chamber 1 to allow the wafers W, which are substrates, to pass between an external transfer arm 10 and the turntable 2. The transfer port 15 is opened and closed by a gate valve (not illustrated in the drawings). Further, lift pins, which penetrate the concave portion 24 to lift up the respective wafer W from a backside surface, and a lifting mechanism for the lift pins (both are not illustrated in the drawings) are provided at corresponding locations under the turntable 2. Thus, the respective wafer W is passed between the external transfer arm 10 and the concave portion 24 of the turntable 2, which is a loading portion, at a location facing the transfer port 15.

Figure 6:
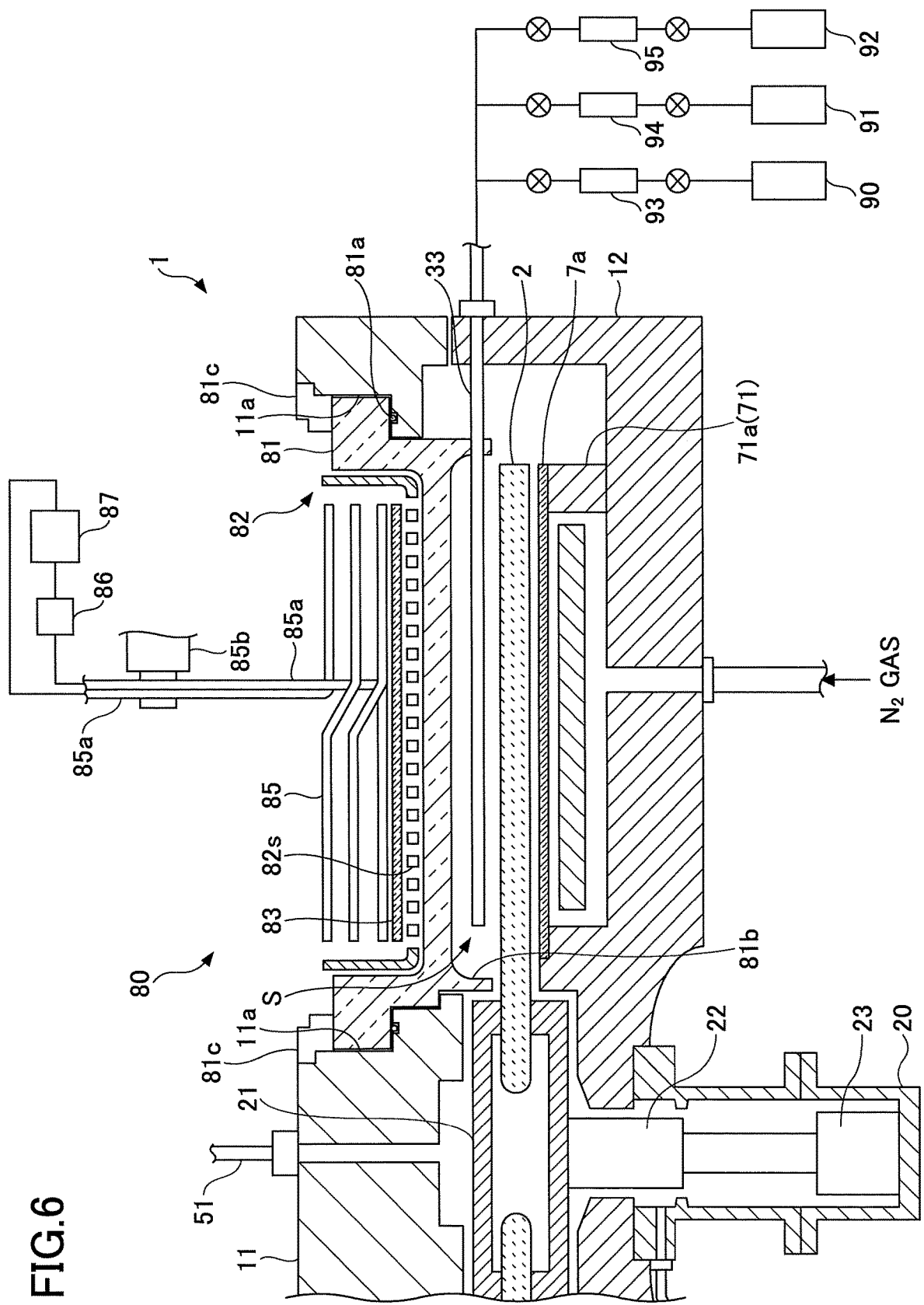
FIG. 6 is a schematic cross-sectional view of an example of a plasma generator provided in the film deposition apparatus illustrated in FIG. 1.
Figure 7:
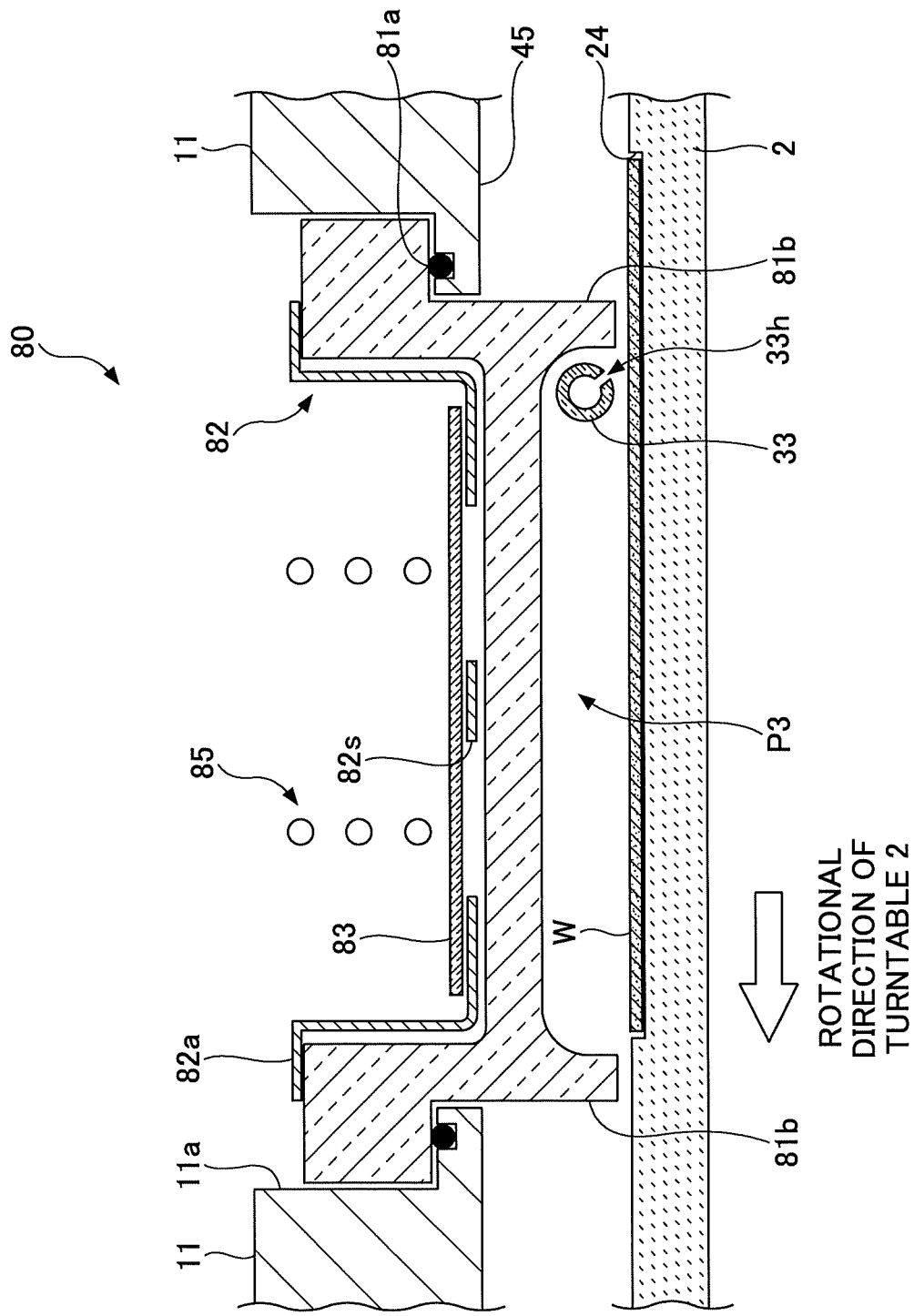
FIG. 7 is another schematic cross-sectional view of the plasma generator provided in the film deposition apparatus illustrated in FIG. 1.
Figure 8:
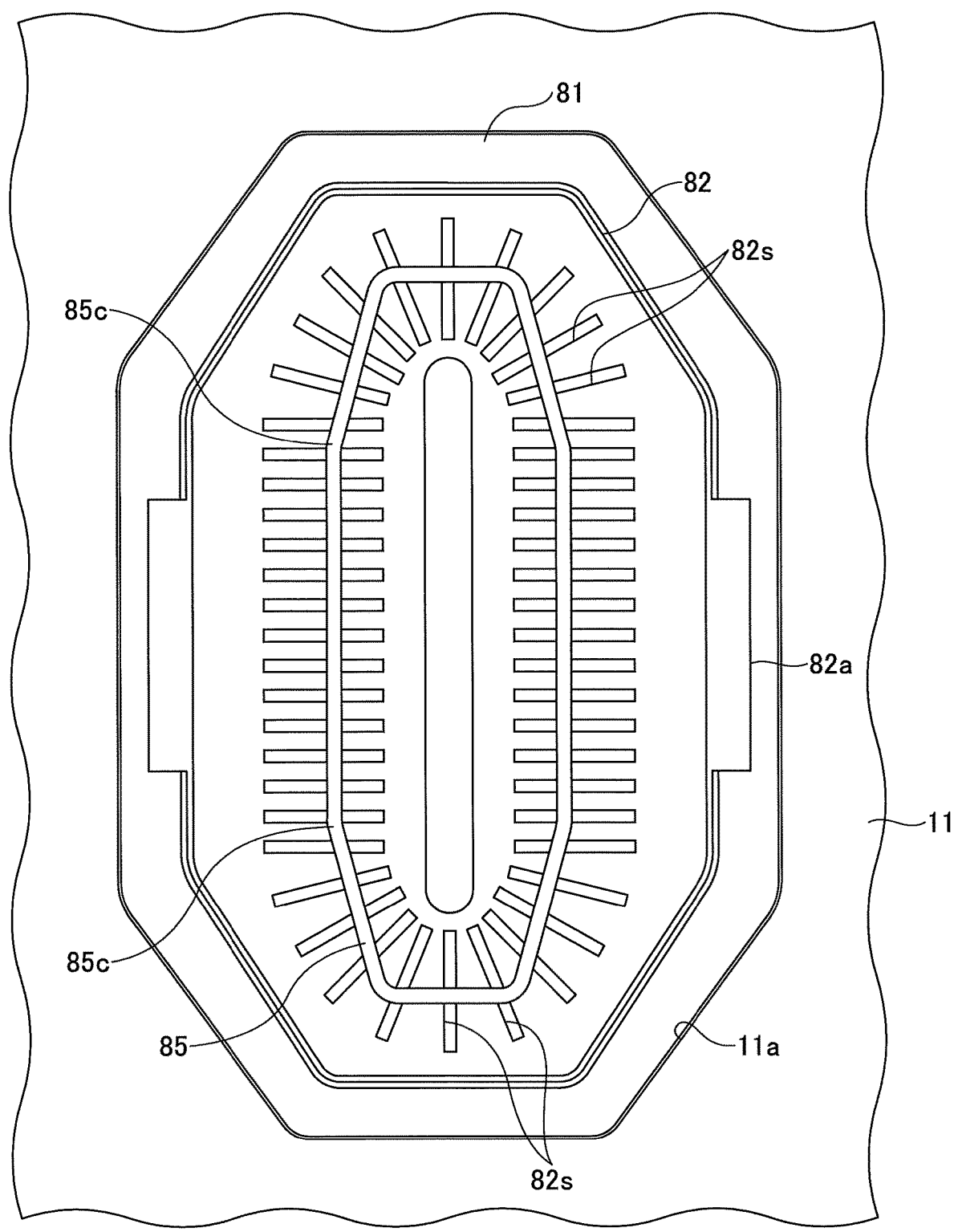
FIG. 8 is a schematic top view of the plasma generator provided in the film deposition apparatus illustrated in FIG. 1.

Next, the plasma generator 80 is described below with reference to FIG. 6 to FIG. 8. FIG. 6 is a schematic cross-sectional view of the plasma generator 80 taken along the radial direction of the turntable 2. FIG. 7 is a schematic cross-sectional view of the plasma generator 80 taken along a direction perpendicular to the radial direction of the turntable 2. FIG. 8 is a schematic top view illustrating the plasma generator 80. For an explanatory purpose, parts of the components are not illustrated in the drawings.

Referring to FIG. 6, the plasma generator 80 is made of a material that is transmissive to radio frequency waves, and includes a concave portion in its upper surface. The plasma generator 80 further includes a frame member 81 which is embedded in an opening 11a provided in the ceiling plate 11, a Faraday shield plate 82 housed in the concave portion of the frame member 81 and has substantially a box shape whose top is opened, an insulating plate 83 placed on a bottom surface of the Faraday shield plate 82, and a coiled antenna 85 supported above or on the insulating plate 83. The antenna 85 has substantially an octagonal planar shape.

The opening 11a of the ceiling plate 11 is formed to have a plurality of step portions, and one of the step portions includes a groove portion to extend along the perimeter where a sealing member 81a such as an O-ring is embedded. The frame member 81 is formed to have a plurality of step portions that correspond to the step portions of the opening 11a, and when the frame member 81 is engaged in the opening 11a, a back side surface of one of the step portions contacts the sealing member 81a embedded in the opening 11a so that the ceiling plate 11 and the frame member 81 are kept in an air-tight manner. Further, as illustrated in FIG. 6, a pushing member 81c, which extends along the outer peripheral of the frame member 81 that is embedded in the opening 11a of the ceiling plate 11, is provided so that the frame member 81 is pushed downward with respect to the ceiling plate 11. Thus, the ceiling plate 11 and the frame member 81 are more reliably kept in an air-tight manner.

The lower surface of the frame member 81 is positioned to face the turntable 2 in the vacuum chamber 1 and a projection portion 81b that projects downward (toward the turntable 2) is provided at the perimeter at the lower surface. The lower surface of the projection portion 81b is close to the surface of the turntable 2, and a plasma process region space (or "third process region") P3 is formed by the projection portion 81b, the surface of the turntable 2 and the lower surface of the frame member 81 above the turntable 2. The space between the lower surface of the projection portion 81b and the surface of the turntable 2 may be the same as the height h1 between the ceiling surface 44 with respect to the upper surface of the turntable 2 in the separation space H (FIG. 4).

Moreover, the reaction gas nozzle 33 that penetrates the projection portion 81b is provided in the plasma process region P3. In the present embodiment, as illustrated in FIG. 6, an argon gas supplying source 90 filled with argon (Ar) gas, an oxygen gas supplying source 91 filled with oxygen ($O_2$) gas and an nitrogen gas supplying source 92 filled with nitrogen ($N_2$) gas are connected to the reaction gas nozzle 33. Ar gas, $O_2$ gas, and $N_2$ gas are supplied at predetermined flow ratio (mixed ratio) controlled by flow controllers 93, 94 and 95 from the argon gas supplying source 90, the oxygen gas supplying source 91, and the nitrogen gas supplying source 92, respectively, to the plasma process region P3. Here, the nitrogen gas supplying source 92 may be filled with $N_2O$, NO or $NO_2$ instead of $N_2$. As long as the nitrogen gas supplying source 92 contain nitrogen element and does not contain hydrogen, a variety of nitrogen-containing gases can be used.

The reaction gas nozzle 33 has a plurality of gas discharge holes 33h formed along the longitudinal direction thereof at a predetermined interval (10 mm, for example) and discharges $Ar/O_2/N_2$ gas from the gas discharge holes 33h. As illustrated in FIG. 7, the gas discharge holes 33h are provided to be inclined from a vertical direction with respect to the turntable 2 toward the upstream rotation direction of the turntable 2. Hence, the gas supplied from the reaction gas nozzle 33 is discharged in a direction opposite to the rotation direction of the turntable 2, specifically, toward a space between a lower surface of the projection portion 81b and the surface of the turntable 2. This prevents the reaction gas and the separation gas from flowing from a space below the ceiling surface 45 and located upstream of the plasma generator 80 into the plasma process region P3 along the rotation direction of the turntable 2. Further, as described above, because the projection portion 81b that is formed along an outer periphery of the lower surface of the frame member 81 is close to the surface of the turntable 2, the pressure in the plasma process region P3 can be kept high by the gas from the reaction gas nozzle 33. This also prevents the reaction gas and the separation gas from flowing into the plasma process region P3.

The Faraday shield plate 82 is made of a conductive material such as a metal and is grounded, although not illustrated in the drawings. As clearly illustrated in FIG. 8, the Faraday shield plate 82 has a plurality of slits 82s at its bottom portion. Each of the slits 82s extends substantially perpendicularly to the corresponding lines of the antenna 85 that has the substantially octagonal planar shape.

As illustrated in FIG. 7 and FIG. 8, the Faraday shield plate 82 includes two support portions 82a at upper end portions provided so as to bend outward. The support portions 82a are supported by the upper surface of the frame member 81 so that the Faraday shield plate 82 is supported at a predetermined position in the frame member 81.

The insulating plate 83 is made of fused quartz, for example, has a size slightly smaller than that of the bottom surface of the Faraday shield plate 82, and is installed on the bottom surface of the Faraday shield plate 82. The insulating plate 83 insulates the Faraday shield plate 82 from the antenna 85 while transmitting the radio frequency wave radiated from the antenna 85.

The antenna 85 is formed by winding a pipe made of copper three times, for example, in a substantially octagonal planar shape. Thus, cooling water can be circulated in the pipe and the antenna 85 is prevented from being heated to a high temperature by the radio frequency power supplied to the antenna 85. The antenna 85 includes a standing portion 85a to which a support portion 85b is attached. The antenna 85 is maintained at a predetermined position in the Faraday shield plate 82 by the support portion 85b. The radio frequency power source 87 is connected to the support portion 85b via a matching box 86. The radio frequency power source 87 is capable of generating radio frequency power of 13.56 MHz, for example.

According to the plasma generator 80 thus structured, when the radio frequency power is supplied to the antenna 85 from the radio frequency power source 87 via the matching box 86, the antenna 85 generates an electromagnetic field. In the electromagnetic field, the electric field component is blocked by the Faraday shield plate 82 so as not to travel downward. On the other hand, the magnetic field component is transmitted into the plasma process region P3 via the plurality of slits 82s of the Faraday shield plate 82. Plasma is generated from $Ar/O_2/N_2$ gas supplied to the plasma process region P3 at a predetermined flow rate ratio (mixed ratio) from the reaction gas nozzle 33 by the magnetic field component. By such plasma, damage to a thin film formed on a wafer W, or to the components in the vacuum chamber 1 can be reduced.

Here, $Ar/O_2/N_2$ gas activated by plasma generated by the plasma generator 80 is described below. In general, when a silicon oxide film ($SiO_2$) is deposited using an aminosilane gas as a source gas, hydroxyl radicals (OH radicals) form adsorption sites, and the aminosilane gas adsorbs on the OH radicals. However, when a recess pattern such as a trench and a via hole is formed in a top surface of a wafer W, and when filling deposition to fill the recess pattern with a film, bottom-up film deposition that deposits the film from a bottom surface of the recess pattern and upward gradually so as not to form a void in the film by closing the upper opening of the recess pattern. To achieve such bottom-up film deposition, not depositing the OH radicals on the top surface of the wafer W is needed. When a mixed gas of a combination of $Ar/O_2/H_2$ is activated by plasma, the OH radicals are generated from $O_2/H_2$, and the OH radicals that are the adsorption sites of the aminosilane gas are formed on the top surface of the wafer W.

In the meantime, because the plasma process is performed to enhance the silicon oxide film, using the plasma containing the combination of $Ar/O_2$ gases and activating $Ar/O_2$ gases are required. However, when $Ar/O_2$ gases are converted to plasma as they are, a phenomenon in which the plasma converted from $Ar/O_2$ gases is less uniform than the plasma converted from $Ar/O_2/H_2$ gases that contain $H_2$, occurs. This phenomenon appears to occur because excitation energy of Ar and $O_2$ is higher than the excitation energy of $H_2$, and higher energy is needed to be converted to plasma as the excitation energy is higher. However, the plasma exited and generated by such high energy is likely to concentrate its energy on corner portions 85c of the antenna 85 illustrated in FIG. 8, which inhibits the generation of uniform plasma. On the other hand, by using $Ar/O_2/H_2$ gases by adding $H_2$ to $Ar/O_2$ gases, $H_2$ plasma is uniformly excited and generated along the shape of the antenna 85 and right below the antenna 85, and the plasma of $Ar/O_2$ gas is considered to be excited and generated uniformly along the shape of the antenna 85 by being influenced by the $H_2$ plasma.

When $H_2$ gas is not added to $Ar/O_2$ gas, such non-uniformity of the plasma is generated, which fails to ensure the uniformity of the plasma process across a surface of the wafer W and fails to perform the film deposition process with high uniformity across the surface of the wafer W. However, as described above, to perform the bottom-up film deposition, $H_2$ cannot be added to the plasma gas. Hence, in the present embodiment, nitrogen ($N_2$) is added to $Ar/O_2$ gas instead of $H_2$, and $Ar/O_2/N_2$ gas is converted to plasma. Nitrogen has excitation energy lower than the excitation energy of Ar and $O_2$, and nitrogen plasma is excited and generated along the shape of the antenna 85 and right below the antenna 85 (within the vacuum chamber 1) by low energy. This allows the uniform plasma to be excited and generated without adding hydrogen to $Ar/O_2$ gases, thereby achieving uniformity across the surface of the wafer W similar to the uniformity achieved by adding hydrogen to $Ar/O_2$ gases. Here, although nitrogen is not a component of the silicon oxide film to be deposited, by using the aminosilane gas that contains amino radicals as the source gas, the reaction of oxygen radicals is prioritized to the reaction of nitrogen radicals and nitrogen gas does not mix into the silicon oxide film. Hence, adding nitrogen gas does not degrade the quality of the silicon oxide film. Details in this regard are described below.

Figure 9:
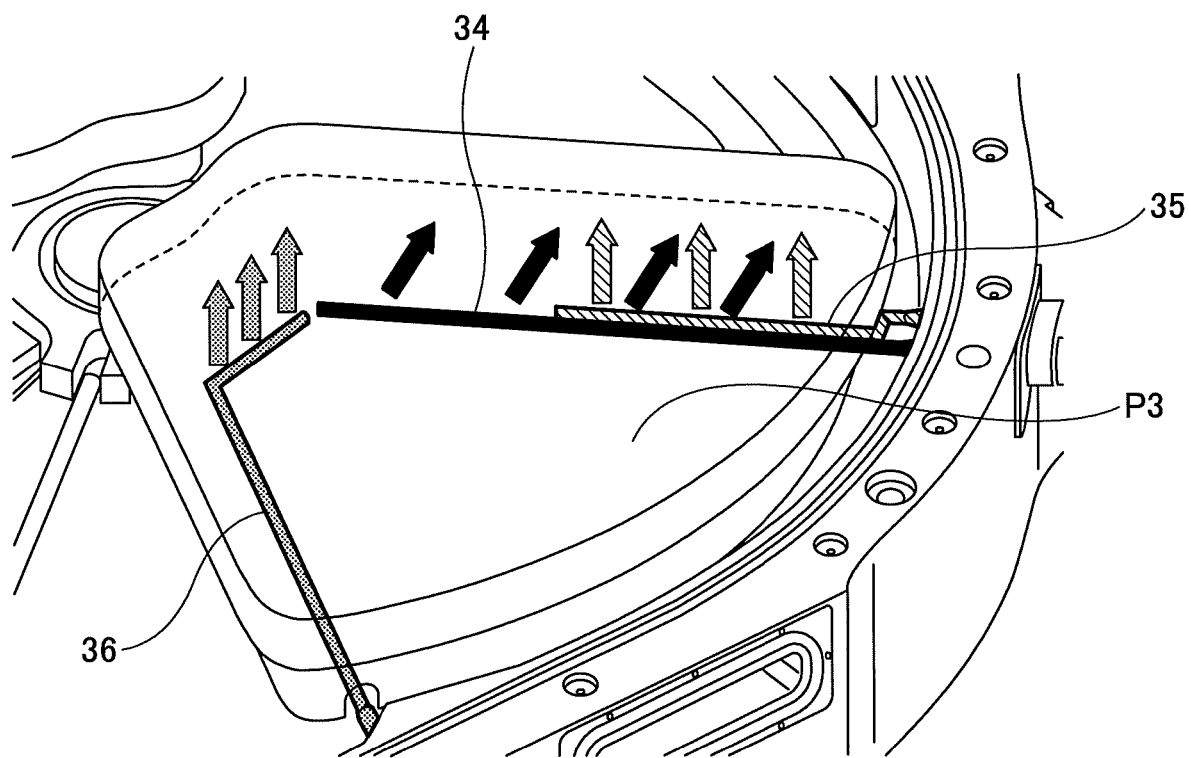
FIG. 9 is a diagram illustrating an example of reaction gas nozzles 34 to 36 different from a reaction gas nozzle 33.

FIG. 9 is a diagram illustrating an example of reaction gas nozzles 34 to 36 having a different form from that of the reaction gas nozzle 33. The mixed gas for plasma generation may be supplied using the plurality of gas nozzles 34 to 36, for example.

As illustrated in FIG. 9, the reaction gas nozzle 34 is a nozzle that can cover the entire area of the concave portion 24 on which the wafer W is arranged and can supply the plasma process gas to the entire surface of the wafer W. In contrast, the reaction gas nozzle 35 is a nozzle that is provided slightly above the reaction gas nozzle 34 so as to approximately overlap with the reaction gas nozzle 34 and has approximately half the length of the reaction gas nozzle 34. Moreover, the reaction gas nozzle 36 has a shape that extends from the outer peripheral wall of the vacuum chamber 1 to the center along the radius on the downstream side of the plasma process region P3 having the fan-like shape in the rotational direction of the turntable, and bents around the central area C and extends linearly along the central area C. Hereinafter, for convenience of distinction, the plasma process gas nozzle 34 covering the whole area may be referred to as a base nozzle 34, and the plasma process gas nozzle 35 covering only the outer area may be referred to as an outer nozzle 35. Also, the plasma process gas nozzle 36 extending to the inside may be referred to as an axis-side nozzle 36.

The base nozzle 34 is a gas nozzle for supplying a mixed gas (which is hereinafter referred to as "plasma process gas") to the whole surface of the wafer W. As illustrated in FIG. 7, the base gas nozzle 33 discharges the plasma process gas toward the projection portion 81b forming the side surface that separates the plasma process region P3 from the other region.

On the other hand, the outer nozzle 35 is a nozzle for supplying a plasma process gas selectively to an outer area of the wafer W.

The axis-side nozzle 36 is a nozzle for supplying a plasma process gas selectively to a central area near the axis of the turntable 2 of the wafer W.

Thus, the plasma process gas may be supplied using the plurality of, for example, three reaction gas nozzles 34 to 36.

As illustrated in FIG. 1, the film deposition apparatus of the embodiment further includes a controller 100 that controls the entirety of the film deposition apparatus and a storing unit 101. The control unit 100 may be a computer. The storing unit 101 stores a program by which the film deposition apparatus 1 executes the film deposition method (as will be explained later) under a control of the control unit 100. The program is formed to include steps capable of executing the film deposition method. The storing unit 101 may be a hard disk or the like, for example. The program stored in the storing unit 101 may be previously stored in a recording medium 102 such as a compact disk (CD), a magneto-optic disk, a memory card, a flexible disk, or the like and may be installed in the storing unit 101 using a predetermined reading device.

The film deposition apparatus of the embodiment also includes a controller 100 implemented by a computer for controlling the operations of the entire film deposition apparatus. The controller 100 includes a memory that stores a program for causing the film deposition apparatus to perform a film deposition method described below. The program may include steps for causing the film deposition apparatus to perform various operations. The program may be stored in a storage unit 101 that forms a storage medium such as a hard disk, a compact disc, a magneto-optical disk, a memory card, or a flexible disk, and installed from the storage unit 101 into the controller 100.

[Film Deposition Method]

Figure 10A:
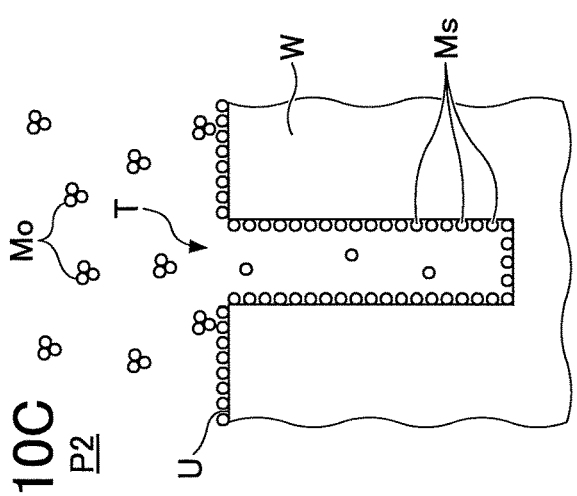
FIGS. 10A through 10F are first schematic diagrams for explaining a film deposition method according to an embodiment.

Next, a film deposition method according to an embodiment is described below citing an example of using the above-described film deposition apparatus. In the present embodiment, a silicon wafer is used as the wafer W and the silicon wafer has a trench T (concave portion) as illustrated in FIG. 10A. The trench T is an example of a recess pattern formed in an upper surface U of the wafer W, and a via hole and the like may be formed other than the trench T. Thus, a shape and a number of the recess pattern formed in the upper surface U are not limited.

Moreover, in the present embodiment, an example is described of supplying an aminosilane gas from the reaction gas nozzle 31, supplying $O_3$ gas from the reaction gas nozzle 32 as an oxidation gas, and supplying a mixed gas of Ar gas, $O_2$ gas and $N_2$ gas (which is hereafter expressed as $Ar/O_2/N_2$ gas) from the reaction gas nozzle 33. With respect to $Ar/O_2/N_2$ gas, the flow rate of Ar is predominantly high, and the flow rate of $N_2$ gas is set at a flow rate less than 1% of the flow rate of Ar gas. For example, when the three reaction gas nozzles 34 to 36 are used, and when the flow rate of Ar is set at the axis-side nozzle 36/main nozzle 34/outer nozzle 35=100/5900/4000 sccm, the flow rate of $O_2$ is set at a level of 0/75/0 sccm, and the flow rate of $N_2$ is set at a level of 0/0/(5-50) sccm, for example. Thus, the amount of addition of $N_2$ only has to be very low. Even if the amount of addition of $N_2$ is very low, the excitation of plasma is led by $N_2$, and the plasma excitation in accordance with the shape of the antenna 85 can be achieved. Here, $Ar/O_2/N_2$ gas may consist of argon gas, oxygen gas and nitrogen gas, or may contain another type of gas as long as the gas does not affect the function of $Ar/O_2/N_2$ gas. Moreover, when another nitrogen-containing gas such as $NO_2$, NO, $N_2O$ is used instead of $N_2$, the mixed gas may consist of argon gas, oxygen gas and the nitrogen-containing gas, or may contain another type of gas. As long as the mixed gas contain argon element, oxygen element and nitrogen element, and does not contain hydrogen element, a variety of combinations of the mixed gas can be used.

To begin with, a gate valve (not illustrated in the drawings) is opened and the wafer W is transferred to the concave portion 24 of the turntable 2 via the transfer port 15 (FIG. 2 and FIG. 3) by the transfer arm 10 (FIG. 3) from outside. This operation is performed by lifting the lift pins (not illustrated in the drawings) via through holes provided at a bottom surface of the concave portion 24 from the bottom portion side of the vacuum chamber 1 when the concave portion 24 stops at a position facing the transfer port 15. By repeating this operation while intermittently rotating the turntable 2, the respective wafers W are loaded into the concave portions 24.

Then, the gate valve is closed, and the vacuum chamber 1 is evacuated by the vacuum pump 640 to the ultimate vacuum level. Then, the separation gas nozzles 41 and 42 discharges $N_2$ or Ar gas as the separation gas at a predetermined flow rate. At this time, the separation gas supplying pipe 51 and the purge gas supplying pipes 72 and 73 also discharge $N_2$ or Ar gas at a predetermined flow rate, respectively. With this, the vacuum chamber 1 is adjusted to a predetermined set pressure by the pressure regulator 650 (FIG. 1). Then, the wafers W are heated to 400° C., for example, by the heater unit 7 while rotating the turntable 2 in a clockwise direction at a rotational speed of 5 rpm, for example.

Subsequently, the reaction gas nozzle 31 (FIG. 2 and FIG. 3) supplies the aminosilane gas, and the reaction gas nozzle 32 supplies $O_3$ gas. Further, the reaction gas nozzle 33 supplies $Ar/O_2/N_2$ gas, and the plasma generator 80 supplies radio frequency power at a power of 4000 W and having a frequency of 13.56 MHz, for example, to the antenna 85. Thus, oxygen plasma is generated in the plasma process region P3 between the plasma generator 80 (FIG. 6) and the turntable 2. The oxygen plasma includes active species such as oxygen ions and oxygen radicals, or high energy particles. Moreover, the oxygen plasma is uniformly excited and generated right below the antenna 85 and along the shape of the antenna 85 due to the action of added nitrogen having low excitation energy.

Figure 10B:
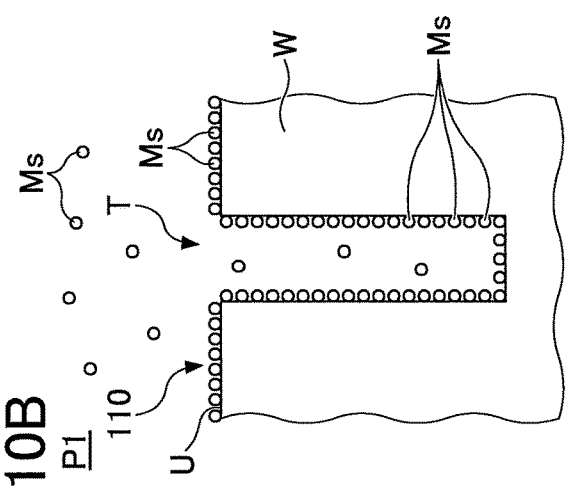
Figure 10C:
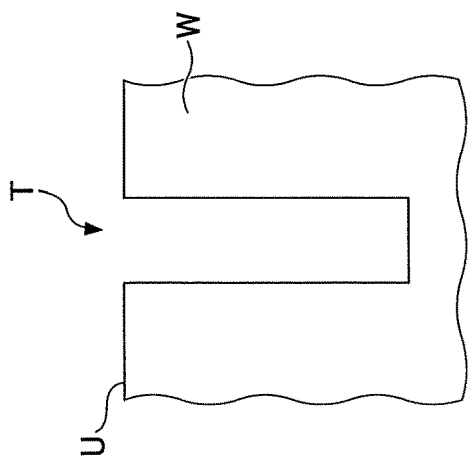
Figure 10D:
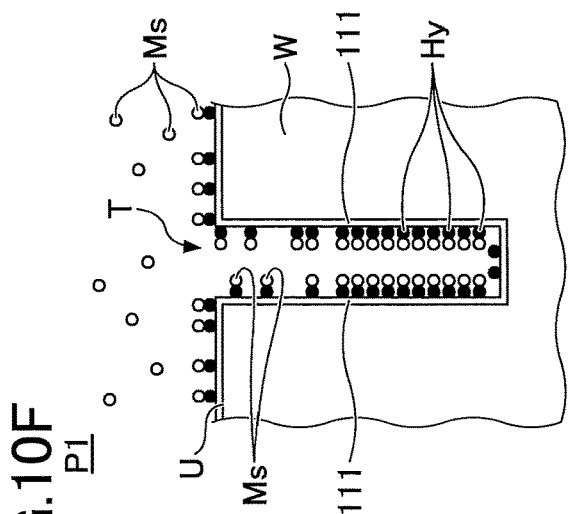

By the rotation of the turntable 2, the wafer W repeatedly passes the first process region P1, the separation region D, the second process region P2, (the lower region of) the third process region P3, and the separation region D in this order (see FIG. 3). In the first process region P1, as illustrated in FIG. 10B, molecules Ms of the aminosilane gas adsorb on the upper surface U of the wafer W and the inner surface of the trench T to form a molecular layer 110 of the aminosilane. After passing through the separation region D, in the second process area P2, as illustrated in FIG. 10C, $O_3$ gas molecules Mo oxidizes the aminosilane gas adsorbed on the upper surface U of the wafer W and the inner surface of the trench T so as to deposit a silicon oxide film 111 on and along the inner surface of the trench T as illustrated in FIG. 10D. When the aminosilane gas is oxidized, OH radicals Hy are generated as a by-product. The generated OH radicals Hy adsorb on the surface of the silicon oxide film 111.

Figure 10E:
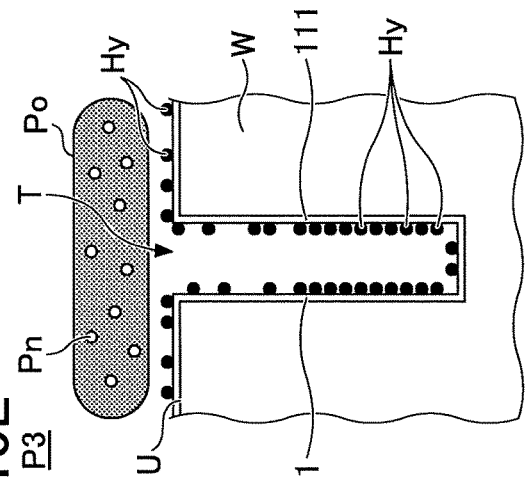

Subsequently, when the wafer W reaches the plasma process region P3 under the plasma generator 80, the wafer W is exposed to the oxygen plasma P1 as illustrated in FIG. 10E. At this time, a part of the OH radicals Hy adsorbed on the silicon oxide film 111 is eliminated from the silicon oxide film 111 by the collision of the high energy particles, for example, in the oxygen plasma Po. The oxygen plasma Po reaches the upper surface U of the wafer W and near the opening of the trench T, however, hardly reaches the vicinity of the bottom portion of the trench T. Thus, a relatively large amount of the OH radicals Hy are eliminated from the upper surface U of the wafer W and the side surface of the trench T near the opening. As a result, as illustrated in FIG. 10E, the OH radicals Hy are distributed such that the density of the OH radicals Hy becomes high at the bottom portion and the side surface near the bottom portion of the trench T, and then becomes lower toward the opening of the trench T and the upper surface U of the wafer W.

Here, the oxygen plasma is excited and generated along the shape of the antenna 85 right below the antenna 85 influenced by $N_2$ that has low excitation energy. Because the antenna 85 is formed to cover the whole of the concave portion 24 in the radial direction of the turntable 2, the uniform oxygen plasma can be generated from the central side to the peripheral side of the turntable 2, and the uniform modification process can be performed in the radial direction. Moreover, because the aminosilane gas contains an amino group, the aminosilane gas hardly reacts to nitrogen radicals and the reaction to the oxygen radicals is prioritized. Hence, the nitrogen radicals do not mix into the silicon oxide film 111, and do not degrade the quality of the silicon oxide film.

Furthermore, as illustrated in FIG. 10E, although a small amount of nitrogen plasma Pn is contained in the oxygen plasma Po, because the silicon oxide film 111 is a film formed by oxidizing the aminosilane, the silicon oxide film 111 contains the amino radicals, which does not form adsorption site for nitrogen radicals but rather repels the nitrogen radicals. Hence, the nitrogen radicals do not mix into the silicon oxide film 111, and do not degrade the quality of the silicon oxide film 111. In other words, the nitrogen plasma only contributes to the uniform generation of plasma and the quality improvement of the silicon oxide film 111. Here, although Ar accounts for most of the plasma, because Ar is a noble gas that contributes to the plasma generation but does not influence the modification reaction, FIG. 10E does not particularly illustrate the action of Ar.

Figure 10F:
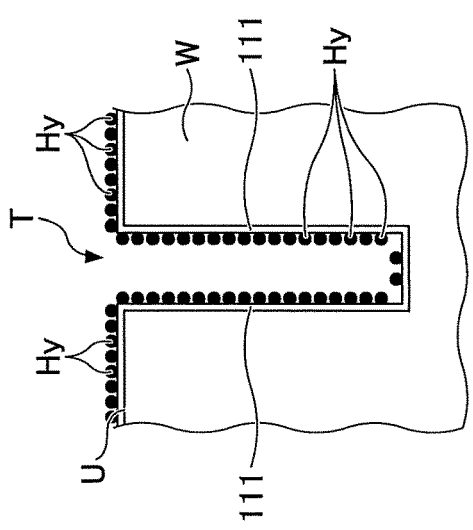

Subsequently, when the wafer W moves back to the first process region P1 by the rotation of the turntable 2, the molecules Ms of the aminosilane gas supplied from the reaction gas nozzle 31 adsorb on the upper surface U of the wafer W and the inner surface of the trench T. At this time, because the molecules Ms of the aminosilane gas are likely to adsorb on the OH radicals Hy, as illustrated in FIG. 10F, the molecules Ms of the aminosilane gas adsorb on the upper surface U of the wafer W and the inner surface of the trench T while being distributed in accordance with the distribution of the OH radicals Hy. In other words, the molecules Ms of the aminosilane gas are distributed in the inner surface of the trench T such that the density at the bottom portion and the side surface near the bottom portion of the trench T becomes high and the density decreases with the decreasing distance from the opening of the trench T.

Moreover, because the uniform modification process is performed on the upper surface U of the wafer W by the uniform plasma of $Ar/O_2/N_2$ gas, the aminosilane gas uniformly adsorb on the upper surface of the wafer W.

Subsequently, when the wafer W passes through the second process region P2, the aminosilane gas adsorbed on the upper surface U of the wafer W and the inner surface of the trench T is oxidized by $O_3$ gas and a silicon oxide film 111 is further deposited as illustrated in FIG. 11A. Here, the thickness distribution of the silicon oxide film 111 reflects the density of the aminosilane gas adsorbed on the inner surface of the trench T. More specifically, the silicon oxide film 111 becomes thicker at the bottom portion and the side surface near the bottom portion of the trench T and becomes thinner toward the opening of the trench T. Then, the OH radicals generated by the oxidization of the aminosilane gas adsorb on the surface of the silicon oxide film 111.

Subsequently, when the wafer W moves back to the plasma process region P3 under the plasma generator 80, as described above, the OH radicals are distributed such that the density of the OH radicals becomes high at the bottom portion and the side surface near the bottom portion of the trench T and decreases with the decreasing distance from the opening of the trench T.

Then, when the above process is repeated, the silicon oxide film 111 is deposited and its film thickness increases from the bottom portion of the trench T, as illustrated in FIG. 11B. When the silicon oxide film 111 becomes further thicker, the trench T is filled with the silicon oxide film 111 without a void, as illustrated in FIG. 11C, and then, the filling of the trench T is completed as illustrated in FIG. 11D.

At this time, with respect to the silicon oxide film 111 on the upper surface of the wafer W, the silicon oxide film 111 having the film thickness and film quality with the preferable uniformity across the surface of the wafer W can be deposited by the uniform plasma process.

As described above, according to the film deposition method according to the present embodiment, the bottom-up deposition can be achieved while keeping the uniformity of the silicon oxide film 111 across the upper surface U of the wafer W preferable. In other words, in the modification process performed on the silicon oxide film 111 in the plasma process region P3, because the oxygen plasma can be uniformly generated, the silicon oxide film 111 can be deposited on the upper surface of the wafer W with the preferable uniformity across the upper surface of the wafer W. Furthermore, with respect to the filling of the trench T, the OH radicals generated by the oxidization of the aminosilane gas and adsorbed on the silicon oxide film 111 are distributed such that the density becomes high at the bottom portion and the side surface near the bottom portion of the trench T and decreases with the decreasing distance from the opening of the trench T due to the oxygen plasma generated by the plasma generator 80. The OH radicals serve as adsorption sites for the aminosilane gas, and the aminosilane gas adsorbs on the OH radicals in accordance with the distribution of the OH radicals. Thus, the aminosilane gas is also distributed such that the density becomes high at the bottom portion and the side surface near the bottom portion of the trench T and decreases with the decreasing distance from the opening of the trench T. Therefore, the silicon oxide film 111 is deposited to be thicker at the bottom portion and the side surface near the bottom portion of the trench T and decreases with the decreasing distance from the opening of the trench T.

Here, in the film deposition method according to the present embodiments, because $O_2/H_2$ gas is not supplied while being converted to plasma, supplementing the OH radicals is not performed. Hence, the silicon oxide film 111 on the upper surface U of the wafer W is likely to be deposited thin. In view of this, it can be said that the film deposition method is likely to perform the bottom-up deposition in total.

Moreover, before performing the film deposition process, a silicon oxide film is preliminarily formed on the surface of the wafer W as an undercoat film, and the film deposition process described in FIGS. 10A through 10F may be performed on the undercoat film. Furthermore, the formation of the undercoat film of the silicon oxide film and the film deposition process described in FIGS. 10A through 10F may be consecutively performed. In this case, for example, the plasma modification may be only performed during the main film deposition process without performing the plasma modification process while forming the undercoat film.

Moreover, in the above embodiment, although the example of using the mixed gas of $Ar/O_2/N_2$ has been described, another nitrogen-containing gas may be used instead of $N_2$. For example, $N_2O$, $NO$ or $NO_2$ can be used as part of the mixed gas. As long as the nitrogen radicals can be generated, and hydrogen radicals are not be generated, a variety of nitrogen-containing gas may be used as the part of the mixed gas.

Working Examples

Next, working examples in which the film deposition method of the present embodiments was performed and evaluation of the result was performed, is described below. Here, the working examples were performed using the film deposition apparatus with the three reaction gas nozzles 34 to 36 illustrated in FIG. 9.

FIGS. 12A through 12D are diagrams showing a result of a working example 1. In the working example 1, $Ar/O_2/N_2$ was supplied using the three reaction gas nozzles 34 to 36 illustrated in FIG. 9. The frame member 81 was also installed in the second process region P2 of the vacuum chamber 1, and the pressure of the second process region P2 was set at 1.8 Torr, and the pressure of the third process region (plasma process region) P # was set at 1.9 Torr. The temperature of the wafer W was set at 400° C. Diisopropylamino(silane) (DIPAS), one of the organic-aminosilane gas, was used as the source gas, and was supplied at a flow rate of 50 sccm. Ozone gas was supplied as the oxidation gas at a concentration of 300 g/Nm³ and at a flow rate of 6000 sccm. In the plasma process region P3, the axis-side nozzle 36/main nozzle 34/outer nozzle 35 supplied Ar at flow rates of 100/5900/4000 sccm, $O_2$ at flow rates of 0/75/0 sccm, and $N_2$ at flow rates of 0/Y/0 sccm, respectively. Here, the flow rate Y of $N_2$ from the main nozzle 34 was set at four types of 5, 10, 25 and 50 sccm. The output of the radio frequency power source 87 was set at 4000 W, and the rotational speed of the turntable 2 was set at 5 rpm. Then, the silicon oxide film 111 was deposited for 4128 seconds. Here, in the working example 1, the evaluation was performed using a wafer W without a recess pattern such as a trench T in an upper surface U.

Figure 12A:
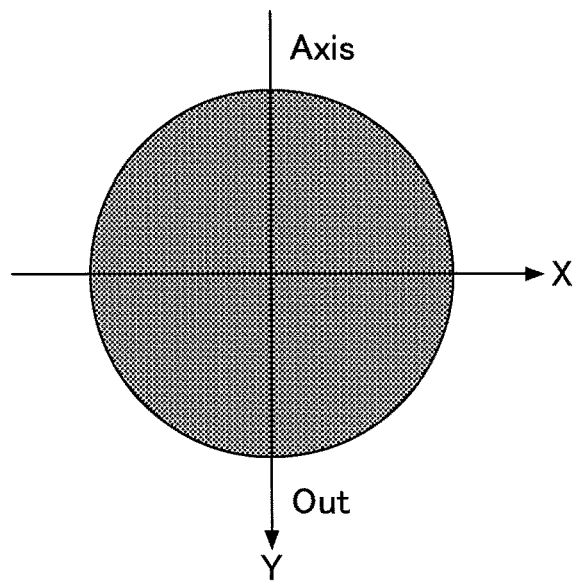
FIGS. 12A through 12D are diagrams showing a result of a working example 1.

FIG. 12A is a diagram for explaining an X axis and a Y axis. The film deposition is performed by placing the wafers W on the concave portions 24 of the turntable 2. As illustrated in FIG. 12A, a direction extending along the rotational direction of the turntable 2 was set to an X axis direction, and a direction extending along the radial direction of the turntable 2 was set to a Y axis direction.

Figure 12B:
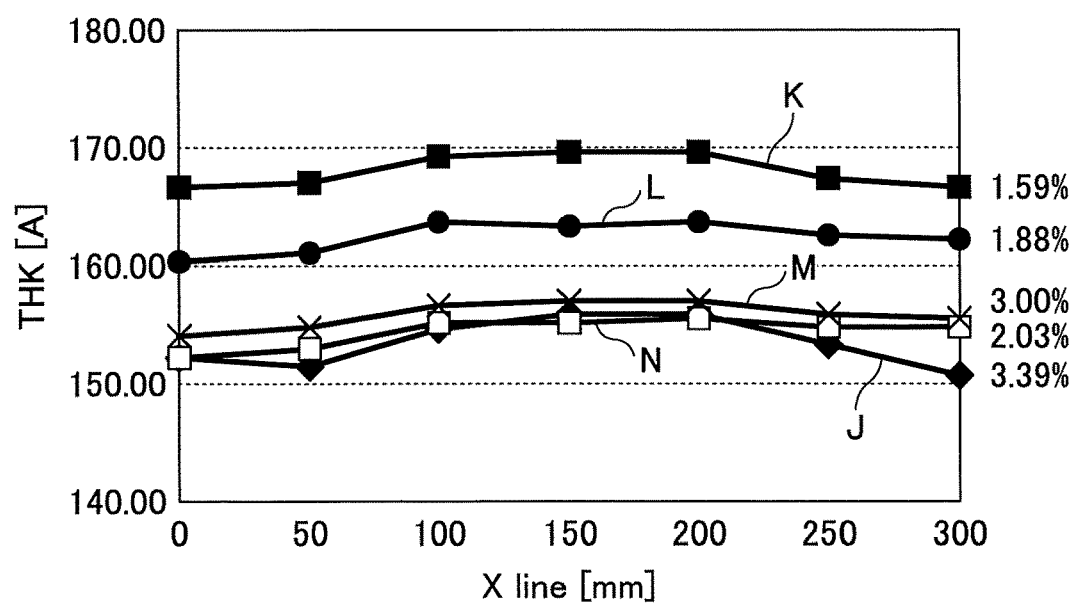
Figure 12C:
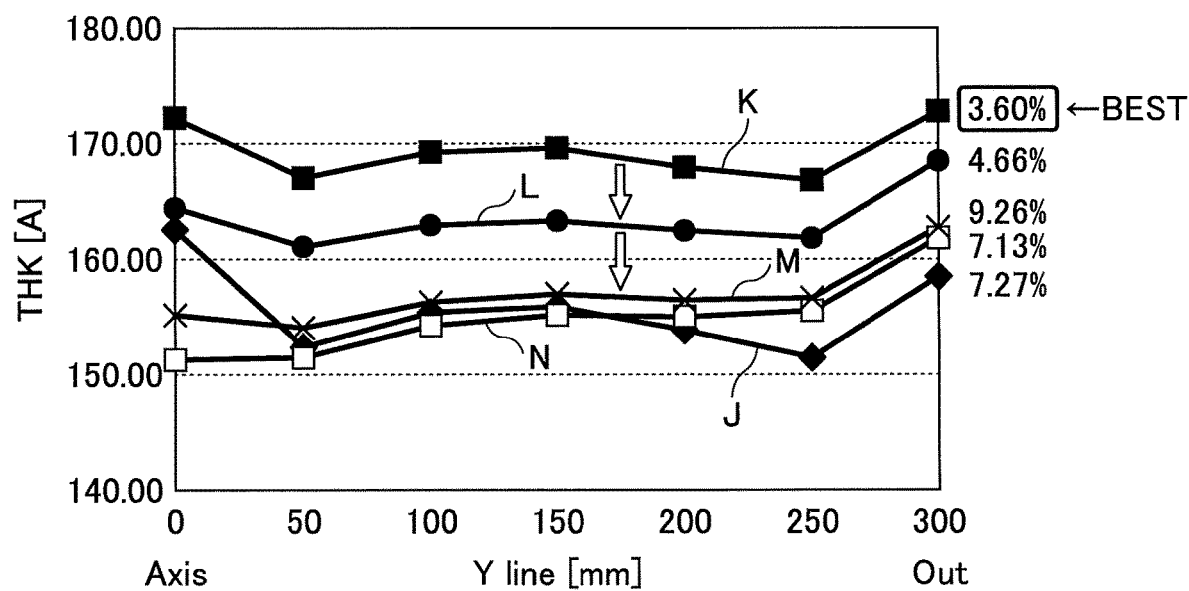

FIG. 12B shows a film thickness of the silicon oxide film 111 deposited on the wafer W in the X axis direction. FIG. 12C shows a film thickness of the silicon oxide film 111 deposited on the wafer W in the Y axis direction. As shown in FIG. 12A, the left side was set to the origin, and the right side was set to 300 mm in the X axis direction. In the Y axis direction, the central axis side was set to the origin, and the outer perimeter side was set to 300 mm.

Figure 12D:
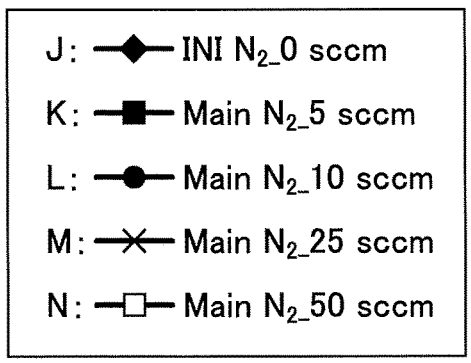

FIG. 12D shows flow rates of $N_2$ from the main nozzle 34 in the graphs of FIGS. 12B and 12C, and the flow rates are set to 0, 5, 10, 25 and 50 sccm, and the results at the flow rates are shown by curves of J, K, L, M and N, respectively. The curve J showing a flow rate of $N_2$ at 0 is a comparative example.

As shown by FIG. 12B, with respect to the X axis direction, the film thickness is approximately constant in any additive amount of $N_2$ shown by the curves J through N, which shows preferable uniformity across the surface of the wafer W. In the X axis direction, because the moving speed is constant at any coordination, the film thickness hardly differs from each other depending on the difference of coordination, as long as the flow rate of $N_2$ is the same as each other. Thus, there is no problem with the uniformity across the surface of the wafer W.

In contrast, in the Y axis direction, the moving speed at a position on the central side differs from the moving speed at a position on the outer peripheral side. Because the moving speed at the position on the outer peripheral side is faster than the moving speed at the position on the central side, the film thickness is generally likely to differ depending on the position. As shown in FIG. 12C, the curve K showing the flow rate of $N_2$ of 5 sccm and the curve L showing the flow rate of $N_2$ of 10 sccm indicate preferable indexes of the uniformity across the surface of the wafer W at 3.60% and 4.66%, respectively (the lower the percentage, the better the uniformity across the surface of the wafer W).

Thus, the result of the working example 1 has indicated that adding a small amount of $N_2$ to $Ar/O_2$ gas can improve the uniformity of film thickness across the surface of the wafer W. Moreover, because the more preferable uniformity across the surface of the wafer W can be obtained as the additive amount of $N_2$ becomes smaller, the result also has indicated that a flow rate ratio or a mixture ratio of $N_2$ to Ar is greater than 0% and smaller than 1%, and preferably smaller than 0.1%.

Figure 13:
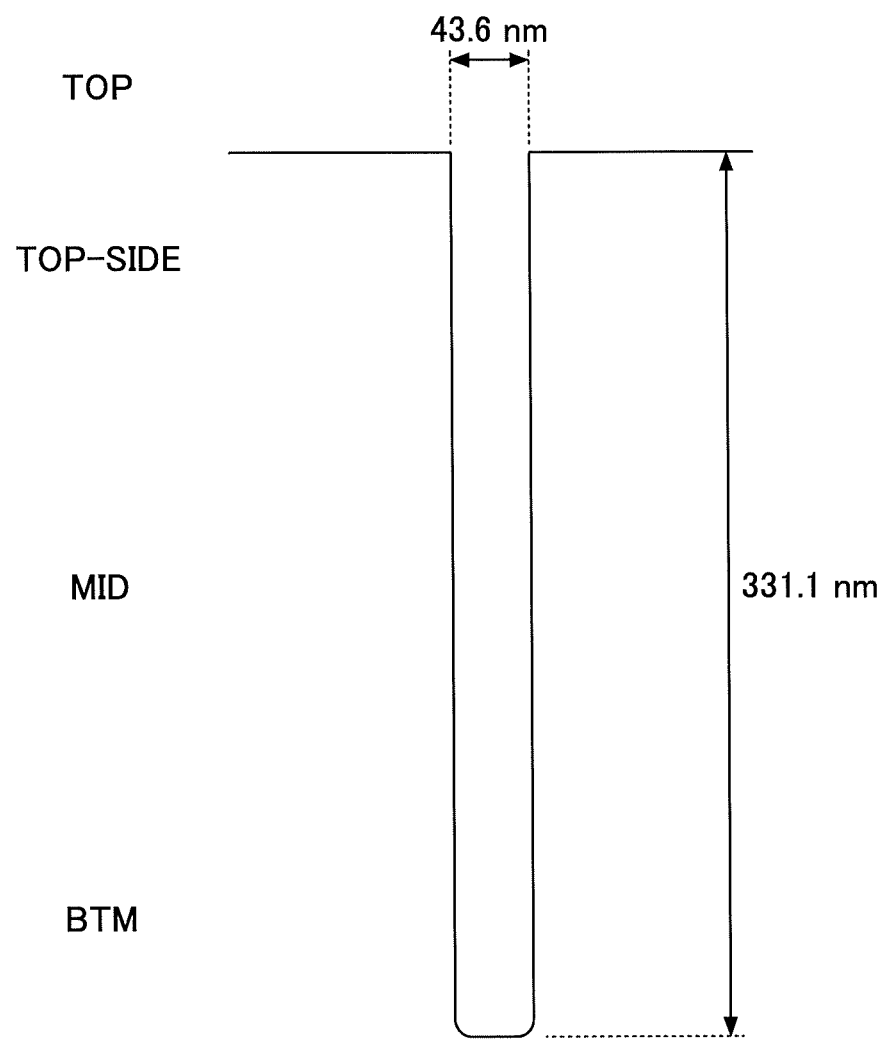
FIG. 13 is a diagram for explaining a shape of a trench T of a wafer W used in a working example 2.

FIG. 13 is a diagram for explaining a shape of a trench T of a wafer W used in a working example 2. In the working example 2, step coverage characteristics of the film deposition in the trench T was evaluated. As shown in FIG. 13, a film was deposited to fill the trench T that has an opening width of 43.6 nm, a depth of 331.1 nm, and an aspect ratio of 7.5 to 8, up to a thickness of 20 nm. Moreover, with respect to positions in the depth direction of the trench T, the upper surface U of the wafer W was expressed by TOP; a position slightly lower than the upper surface U was expressed as TOP-SIDE; the vicinity of the middle was expressed as MID; and the bottom surface was expressed as BTM.

The conditions of the working example 2 were made the same as the conditions of the working example 1. With respect to the flow rate of $N_2$ added to $Ar/O_2$ gas, three types of 0, 5, and 50 sccm were set as the conditions.

Figure 14:
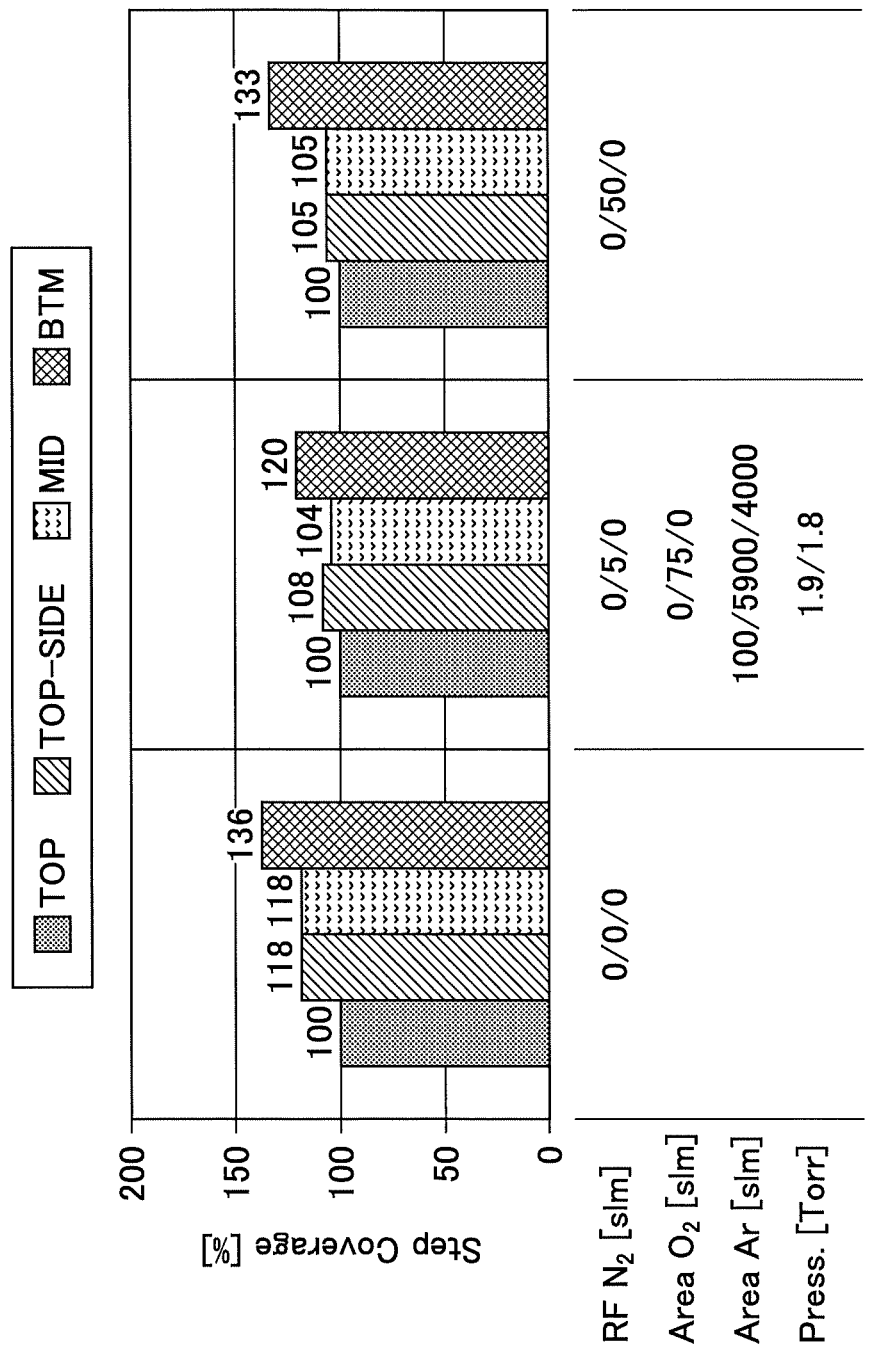
FIG. 14 is a diagram showing a result of a working example 2.

FIG. 14 is a diagram showing a result of the working example 2. As shown in FIG. 14, in any pattern of the additive amount of $N_2$ at 0, 5, and 50 sccm, the step coverage of the bottom surface (BTM) was the greatest, and the step coverage decreased with decreasing the distance from TOP, which indicated that the bottom-up deposition was achieved.

Figure 15:
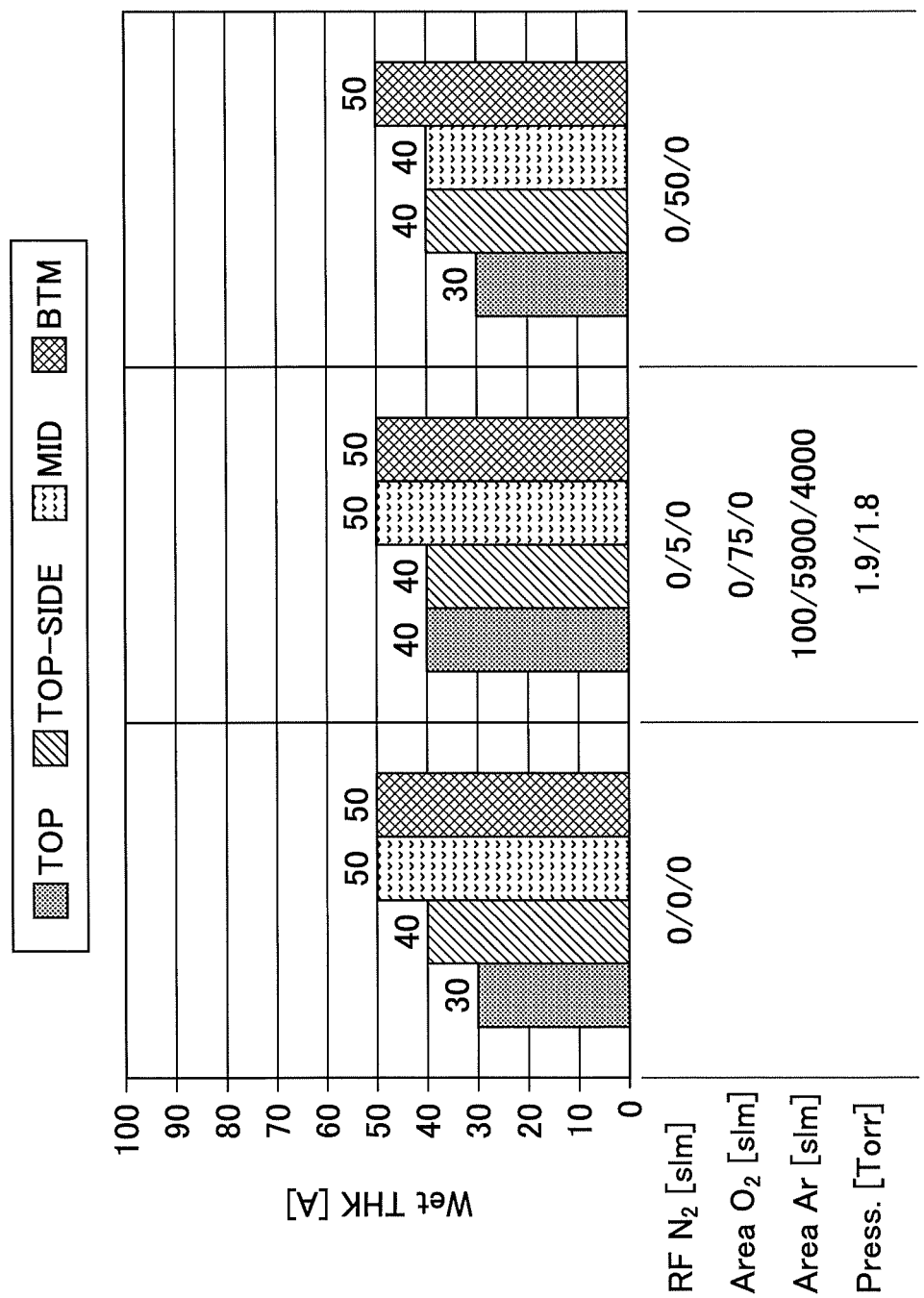
FIG. 15 is a diagram showing a result of a working example 3.

FIG. 15 is a diagram showing a result of a working example 3. In the working example 3, an wet etching was performed on the silicon oxide film in the trench T, and whether the etching characteristics were influenced or not of the silicon oxide film was evaluated. The conditions of the working example 3 were the same as the conditions of the working example 1. As shown in FIG. 15, similar etching thicknesses were obtained in the case of adding $N_2$ (two results on the right side) to the case without adding $N_2$ (the left end), which indicated that there is no problem with the etching characteristics.

Figure 16:
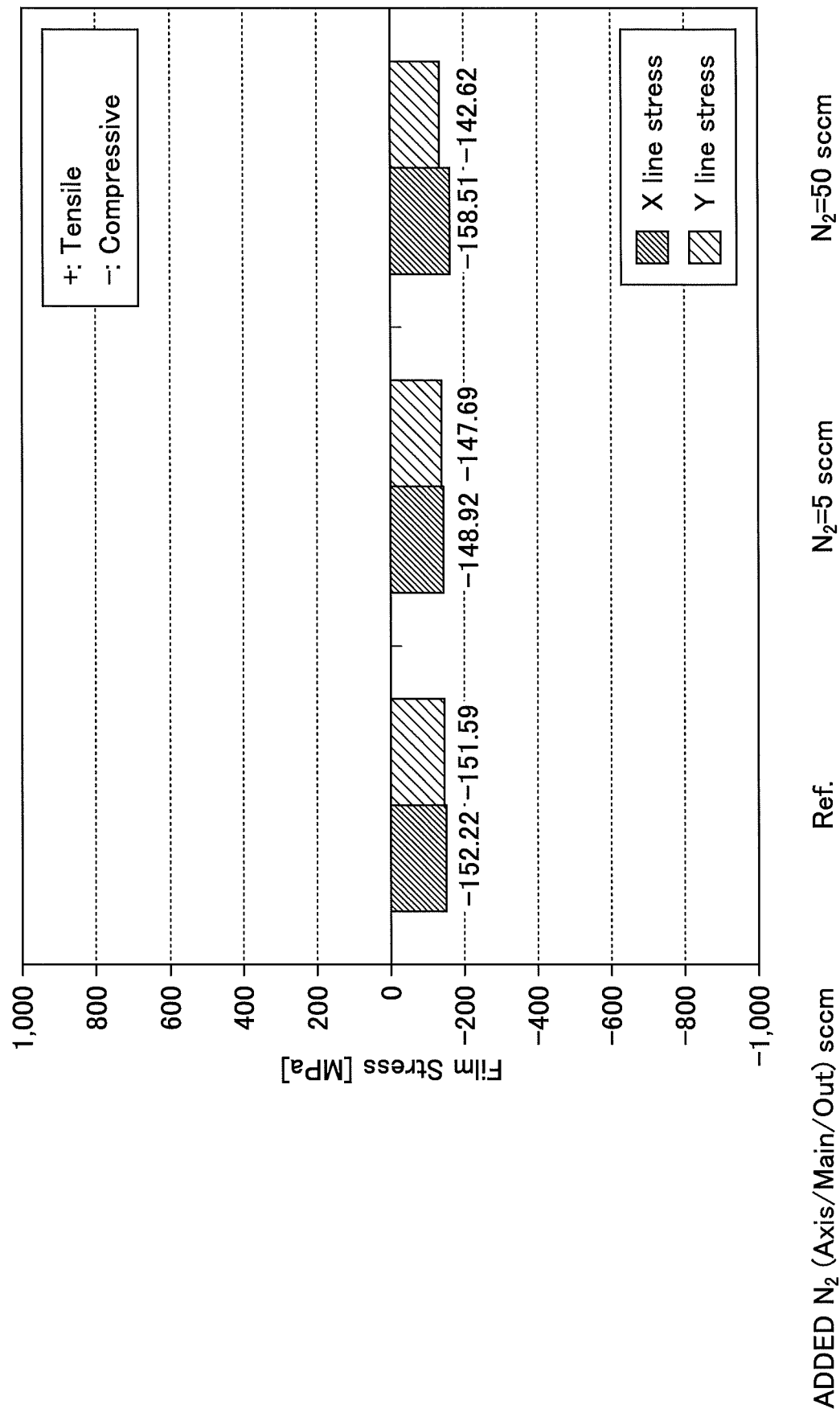
FIG. 16 is a diagram showing a result of a working example 4.

FIG. 16 is a diagram showing a result of a working example 4. In the working example 4, stresses on the silicon oxide film 111 in the trench T were evaluated. The conditions of the working example 4 were the same as the conditions of the working example 1. In FIG. 16, the plus side in the vertical direction shows a tensile stress, and the minus side in the vertical direction shows a compressive stress. Similar results were obtained in the case without adding $N_2$ (on the left end), the case of adding $N_2$ at a flow rate of 5 sccm (the middle) and the case of adding $N_2$ at a flow rate of 50 sccm (the right end), which indicated that adding $N_2$ had no impact on the stress characteristics of the silicon oxide film 111.

Figure 17:
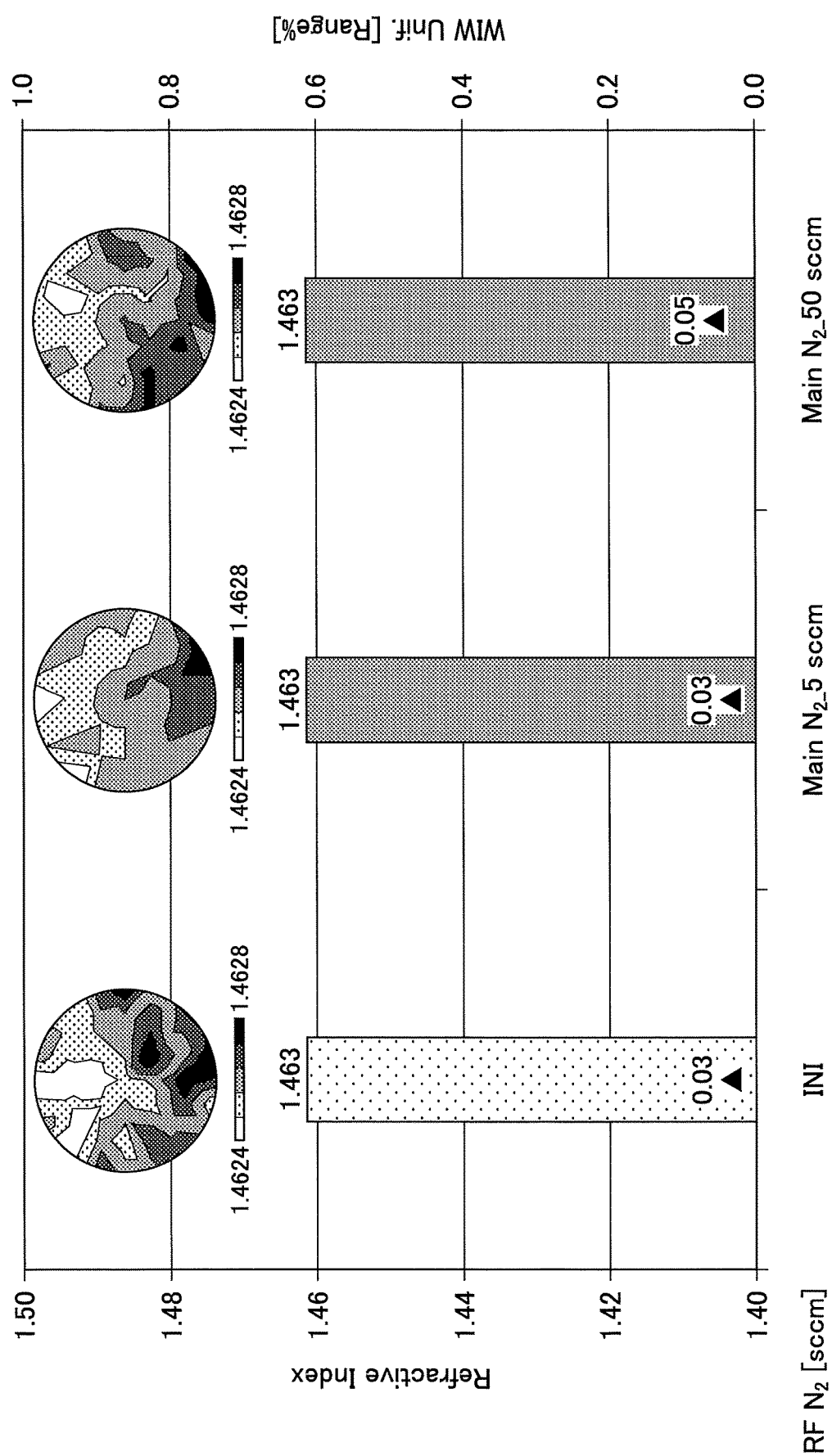
FIG. 17 is a diagram showing a result of a working example 5.

FIG. 17 is a diagram showing a result of a working example 5. In the working example 5, refraction indexes of the silicon oxide film in the trench T were evaluated. The conditions of the working example 5 were the same as the conditions of the working example 1. FIG. 17 shows the refraction indexes and their uniformity across the surface of the wafer W in the vertical axis. As shown in FIG. 17, the same refraction index, which was 1.463, was obtained in the case without adding $N_2$ (the left end), the case of adding $N_2$ at a flow rate of 5 sccm (the middle) and the case of adding $N_2$ at a flow rate of 50 sccm (the right end), and similar results of 0.03 and 0.05 were obtained with respect to the uniformity across the surface of the wafer W. The results indicated that adding $N_2$ had no impact on the refraction index of the silicon oxide film 111.

Thus, the working examples 1 through 5 have indicated that performing the modification process on the silicon oxide film 111 by adding a small amount of $N_2$ to Ar/$O_2$ have no impact on any characteristics of the silicon oxide film 111 and can improve the uniformity across the surface of the wafer W while performing the bottom-up film deposition.

As discussed above, according to the embodiments of the disclosure, a silicon oxide film with preferable uniformity across a surface of a substrate can be deposited.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that various changes, substitutions, and alterations could be made hereto without departing from the spirit and scope of the invention.

What is claimed is:

1. A film deposition method, comprising:
   adsorbing an aminosilane gas on a surface of a substrate including a recess pattern;
   depositing a silicon oxide film on the surface of the substrate including the recess pattern by oxidizing the aminosilane gas adsorbed on the surface of the substrate using an oxidation gas; and
   modifying the silicon oxide film by supplying a mixed gas containing oxygen, argon and nitrogen to the silicon oxide film while activating the mixed gas by plasma generated using an antenna, oxygen plasma being generated under the antenna induced by nitrogen plasma generated under the antenna, the nitrogen plasma having excitation energy smaller than excitation energy of the oxygen plasma.

2. The film deposition method according to claim 1, wherein a mix ratio of nitrogen to argon in the mixed gas is less than 1%.

3. The film deposition method according to claim 1, wherein the steps of adsorbing the aminosilane gas, depositing the silicon oxide film and modifying the silicon oxide film are repeated periodically.

4. The film deposition method according to claim 3, further comprising:
   supplying a first purge gas to the surface of the substrate between the steps of adsorbing the aminosilane gas on the surface of the substrate and depositing the silicon oxide film on the surface of the substrate; and
   supplying a second purge gas to the surface of the substrate between the steps of modifying the silicon oxide film and adsorbing the aminosilane gas on the surface of the substrate.

5. The film deposition method according to claim 4, wherein the steps of adsorbing the aminosilane gas on the surface of the substrate, supplying the first purge gas to the surface of the substrate, depositing the silicon oxide film on the surface of the substrate, modifying the silicon oxide film, and supplying the second purge gas to the surface of the substrate, are repeated until filling up the recess pattern with the silicon oxide film.

6. The film deposition method according to claim 4, wherein the substrate is arranged on a turntable along a circumferential direction of the turntable provided in a process chamber,
   wherein the process chamber includes an aminosilane adsorption region, a first purge region, an oxidation region, a modification region, a second purge region above the turntable and along a rotational direction of the turntable, and
   wherein the steps of adsorbing the aminosilane gas on the surface of the substrate, supplying the first purge gas to the surface of the substrate, depositing the silicon oxide film on the surface of the substrate, modifying the silicon oxide film, and supplying the second purge gas to the surface of the substrate, are periodically repeated by rotating the turntable.

7. The film deposition method according to claim 6, wherein the nitrogen-containing gas includes $N_2$, $N_2O$, NO and/or $NO_2$.

8. The film deposition method according to claim 1, wherein nitrogen is supplied to the mixed gas by adding a nitrogen-containing gas to the mixed gas.

9. The film deposition method according to claim 1, wherein the mixed gas does not contain hydrogen.

10. The film deposition method according to claim 1, wherein the aminosilane gas is an organic-aminosilane gas.

11. The film deposition method according to claim 1, wherein the oxidation gas contains ozone and/or oxygen.

12. The film deposition method according to claim 1, wherein the plasma is inductively coupled plasma generated using an antenna.

13. The film deposition method according to claim 1, wherein an undercoat film is preliminarily formed on the surface of the substrate.

14. The film deposition method according to claim 1, wherein the mixed gas consists of oxygen, argon and nitrogen.

* * * * *